United States Patent
Horio et al.

(10) Patent No.: US 7,023,264 B2
(45) Date of Patent: Apr. 4, 2006

(54) NONLINEAR RESISTOR CIRCUIT USING FLOATING GATE MOSFETS

(75) Inventors: Yoshihiko Horio, Saitama (JP); Tetsuya Fujiwara, Kanagawa (JP); Kazuyuki Aihara, Chiba (JP)

(73) Assignee: Japan Science and Technology Agency, Kawaguchi (JP)

( * ) Notice: Subject to any disclaimer, the term of this patent is extended or adjusted under 35 U.S.C. 154(b) by 79 days.

(21) Appl. No.: 10/500,858

(22) PCT Filed: Jan. 22, 2003

(86) PCT No.: PCT/JP03/00513

§ 371 (c)(1),
(2), (4) Date: Jul. 19, 2004

(87) PCT Pub. No.: WO03/063349

PCT Pub. Date: Jul. 31, 2003

(65) Prior Publication Data

US 2005/0121723 A1  Jun. 9, 2005

(30) Foreign Application Priority Data

Jan. 24, 2002  (JP) ............................ 2002-014989

(51) Int. Cl.
*H01J 19/82* (2006.01)

(52) U.S. Cl. ..................................... 327/568; 327/570
(58) Field of Classification Search ..................... None
See application file for complete search history.

(56) References Cited

U.S. PATENT DOCUMENTS 3,252,005 A * 5/1966 Pendred ...................... 327/195
3,479,526 A * 11/1969 Stanchi .......................... 327/77
6,356,136 B1 * 3/2002 Horio et al. ................. 327/390

FOREIGN PATENT DOCUMENTS

| JP | 39-3222 | 3/1964 |
| JP | 2000-68788 | 3/2000 |

* cited by examiner

Primary Examiner—Tuan T. Lam
(74) Attorney, Agent, or Firm—Oblon, Spivak, McClelland, Maier & Neustadt, P.C.

(57) ABSTRACT

An N-shaped nonlinear resistor circuit using floating gate MOSFETs; to realize various N-shaped characteristics that can be approximated by piecewise linear functions of third to seventh orders and further to realize N-shaped V-I characteristics that can variously change those characteristics by use of external voltages. A Λ-type nonlinear resistor circuit (1) and a V-type nonlinear resistor circuit (2) using multi-input floating gate MOSFETs are connected in parallel, and the currents of the Λ-type and V-type nonlinear resistor circuits are added together, thereby providing various N-shaped voltage-current characteristics.

11 Claims, 18 Drawing Sheets

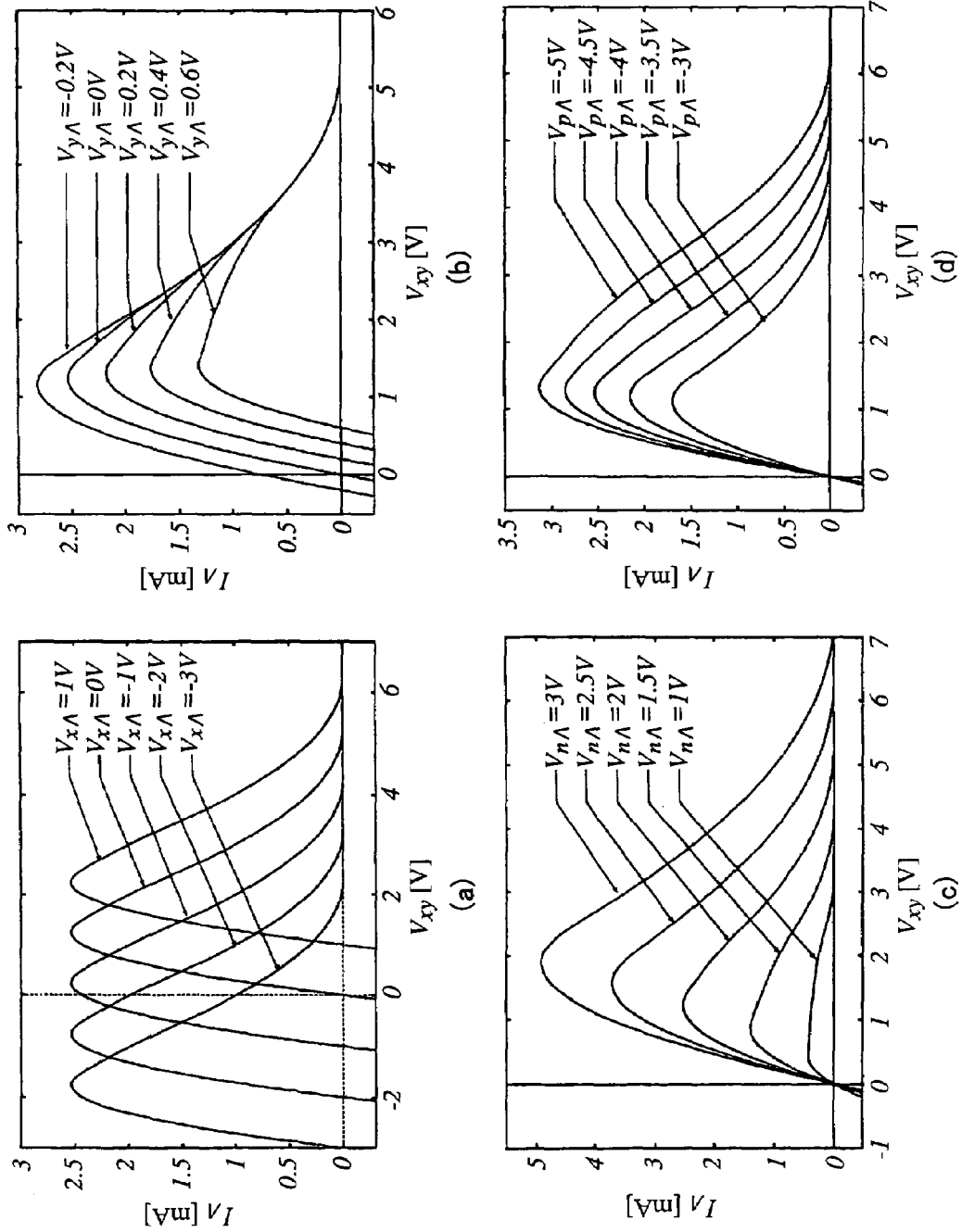
F I G. 2

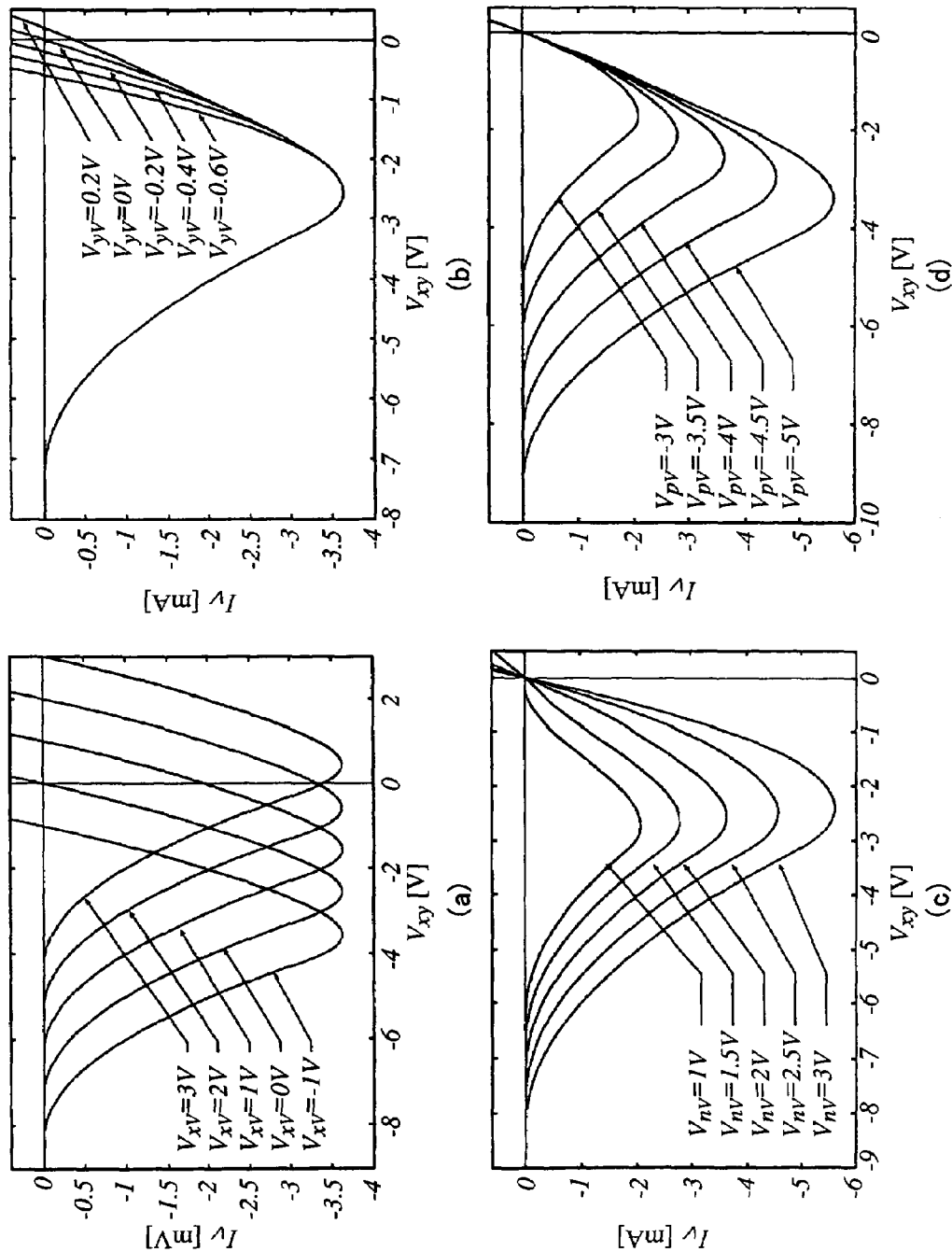
F I G. 3

F I G. 15
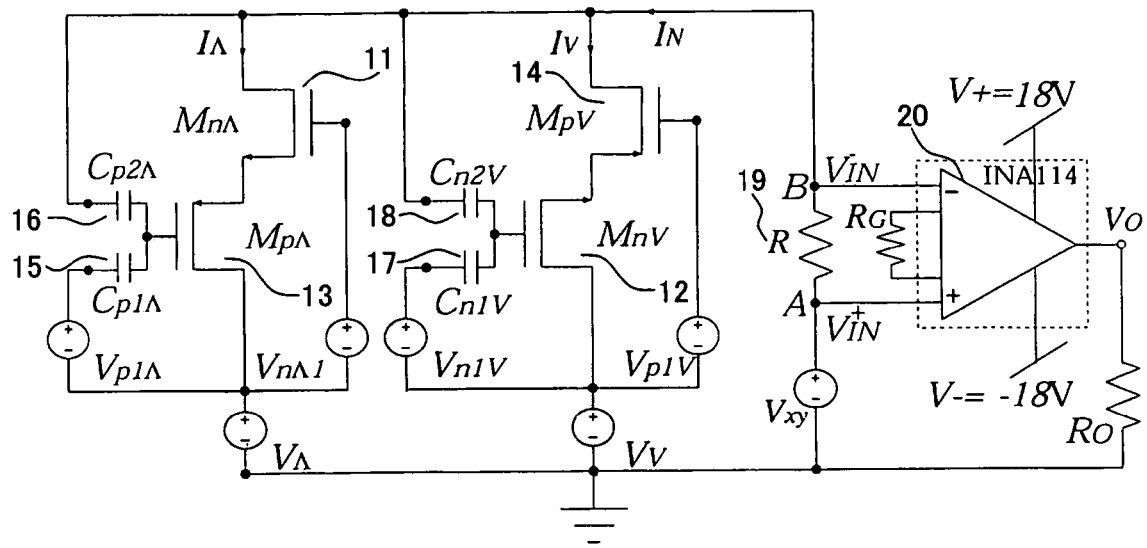
F I G. 16
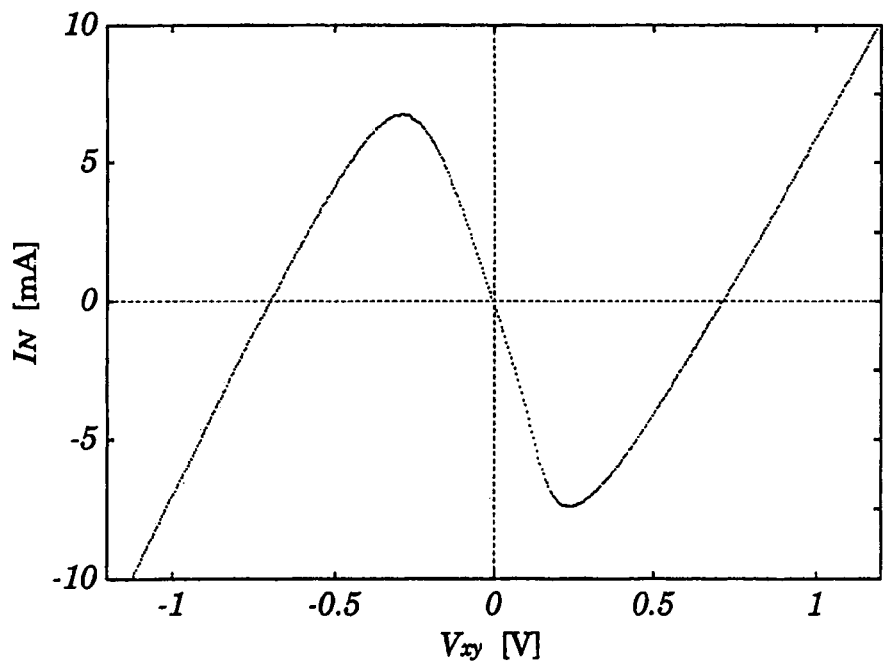

F I G. 17
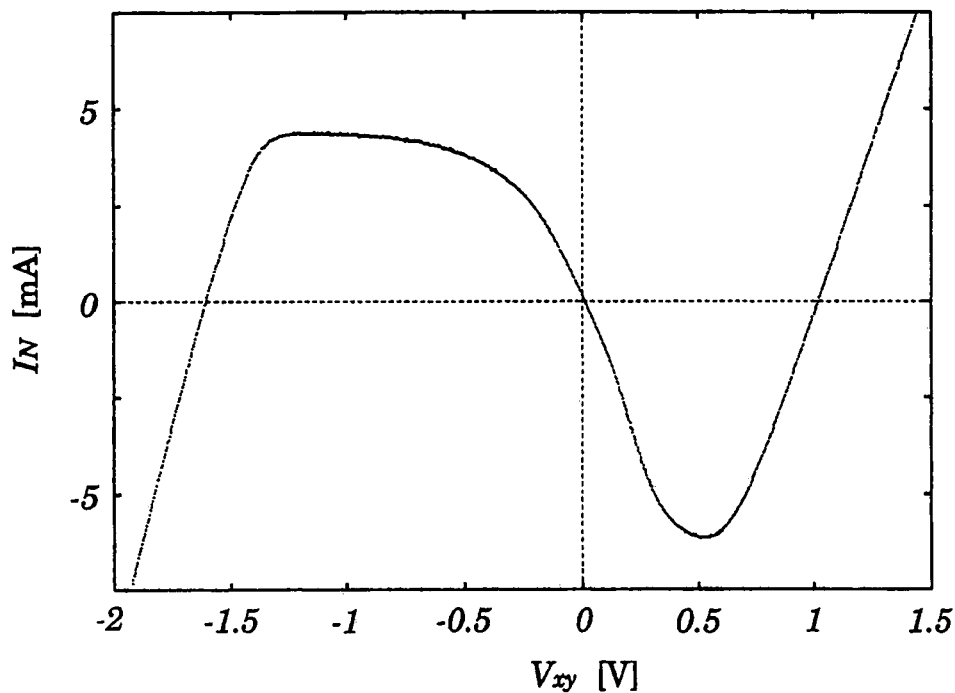
F I G. 18
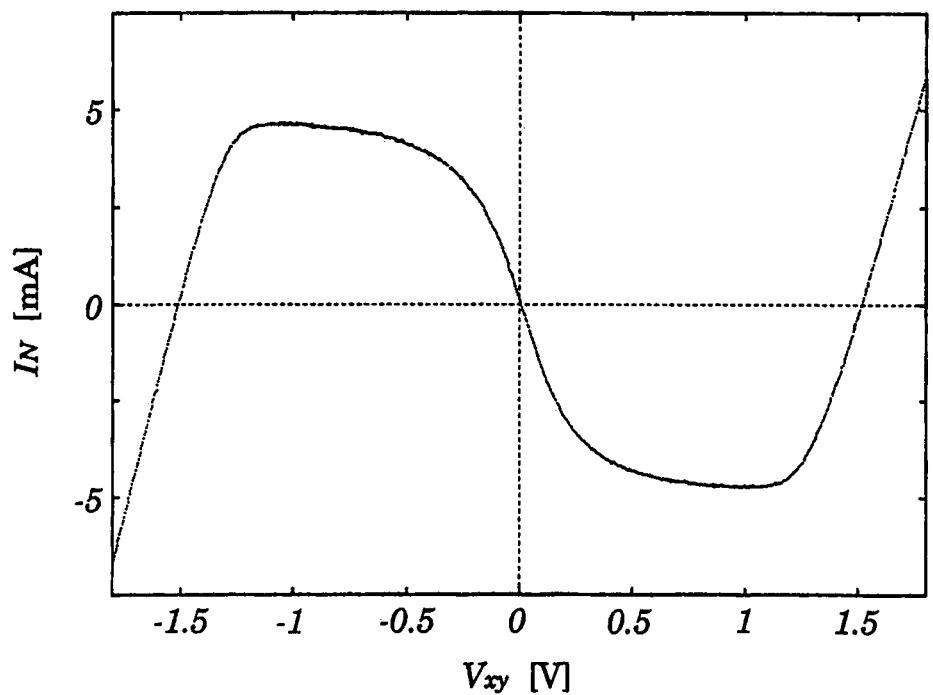

F I G. 19
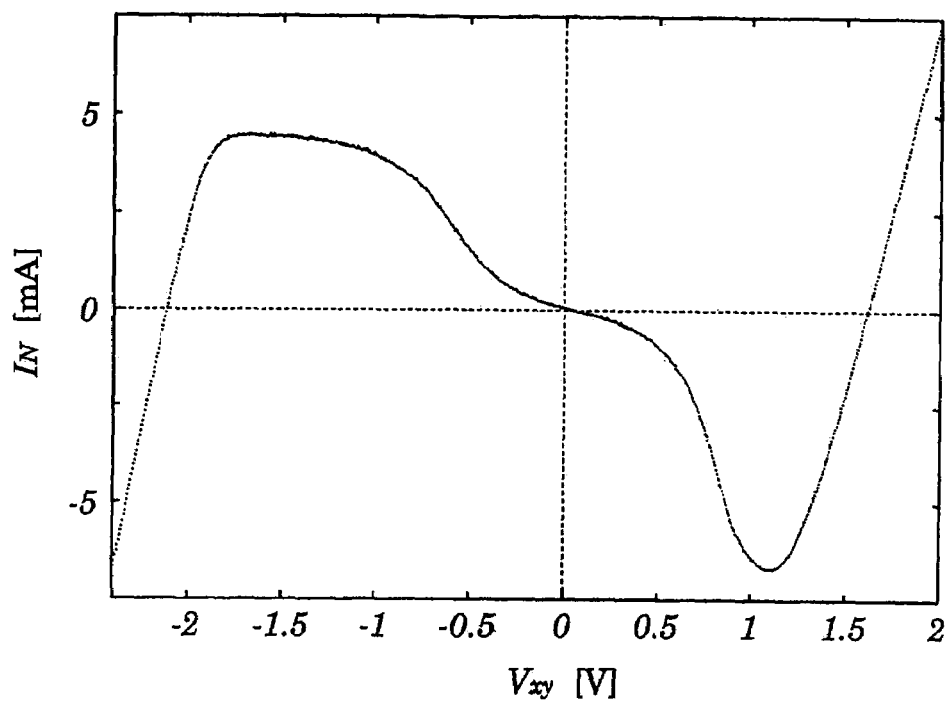
F I G. 20
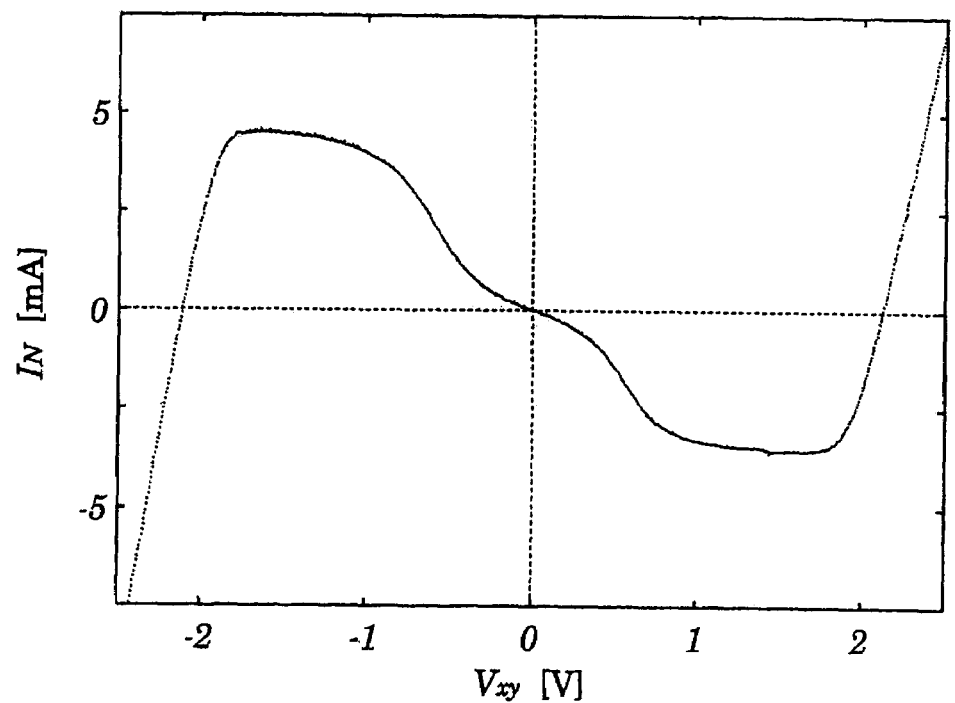

F I G. 21
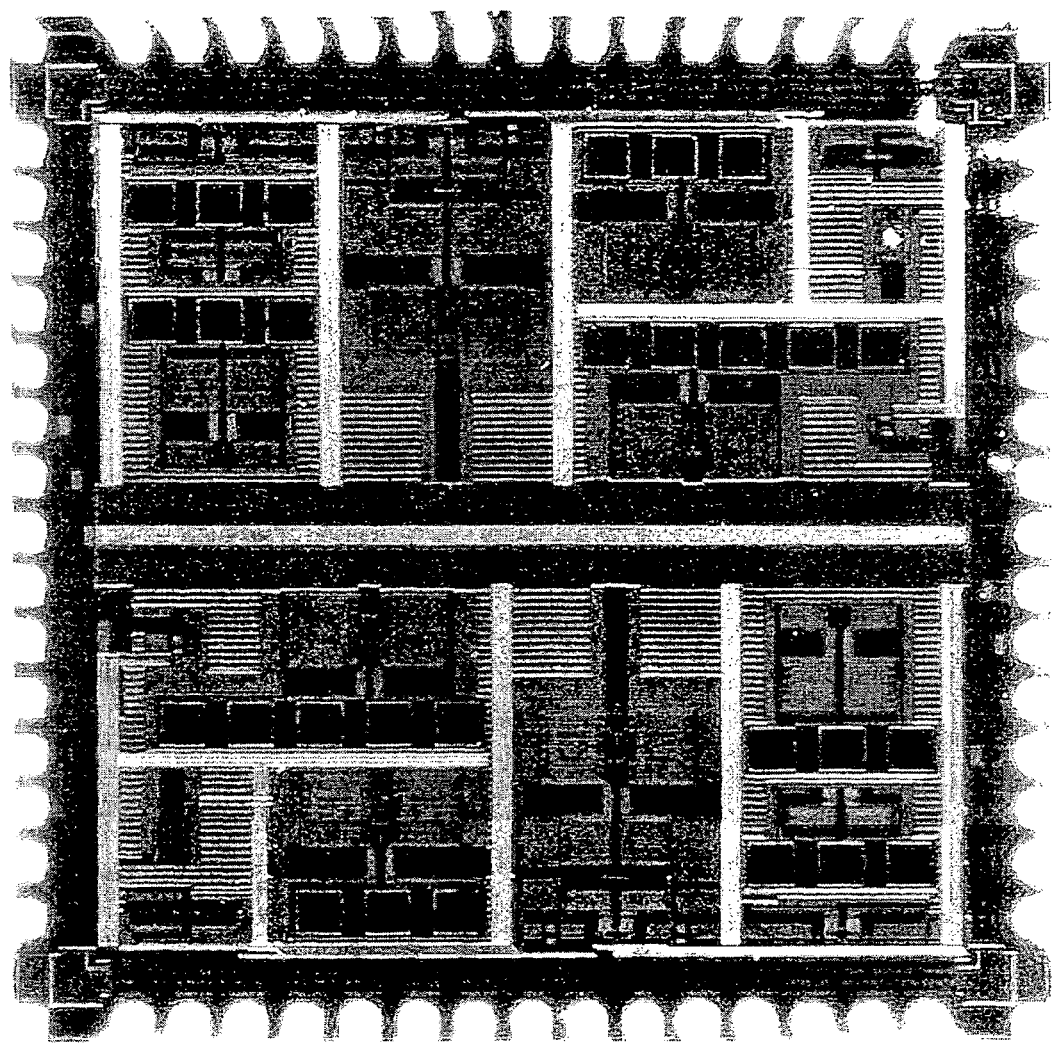

F I G. 28
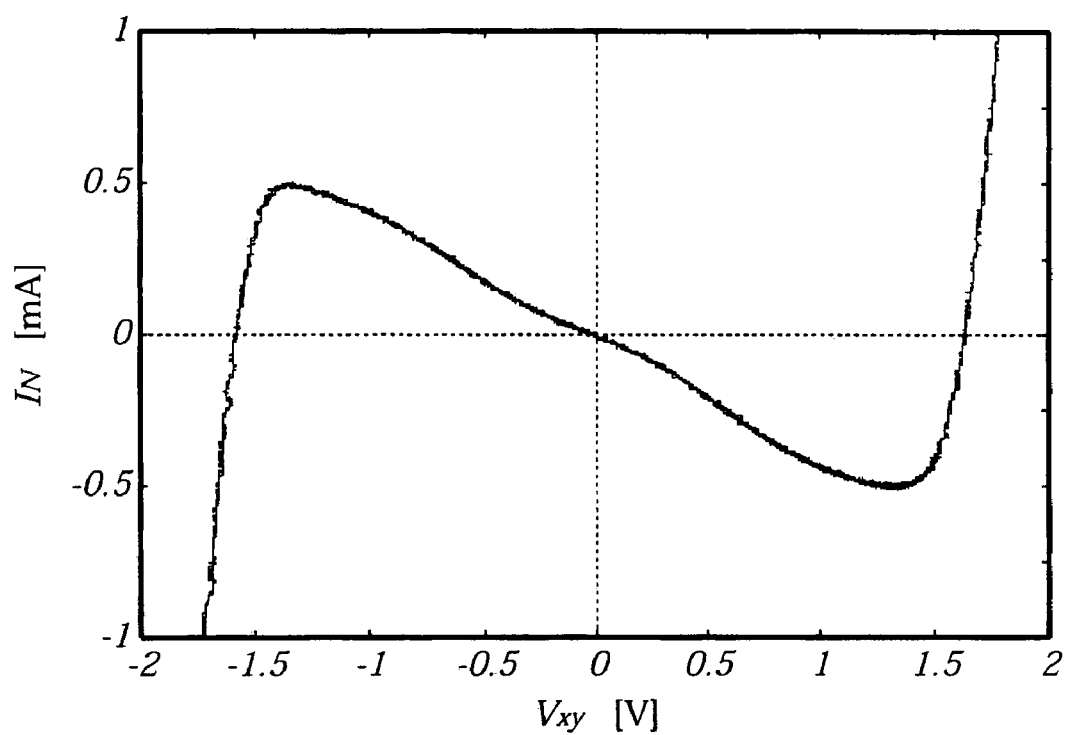

NONLINEAR RESISTOR CIRCUIT USING FLOATING GATE MOSFETS

TECHNICAL FIELD

The present invention relates to a nonlinear resistor circuit using floating gate MOSFETs, and more particularly, to a circuit which realizes various N-shaped voltage-current characteristics.

BACKGROUND ART

Conventionally, reference documents on the above-mentioned field include the following disclosures.

Reference document (1): Japanese Patent no. 3,007,327: Y. Horio, K. Watarai, and K. Aihara, "Nonlinear resistor circuits using capacitively coupled multi-input MOSFETs," IEICE Trans. Fundamentals, vol. E82-A, no. 9, pp. 1926–1936, 1999.

Reference Document (2): K. Matsuda, Y. Horio, and K. Aihara, "A simulated LC oscillator using multi-input floating-gate MOSFETs," in Proc. IEEE Int. Symp. on Circuits and Syst,. vol. III, pp. 763–766, 2001.

Reference document (3): Kinya Matsuda, Tomonori Amano, Yoshihiko Horio, and Kazuyuki Aihara, "LC oscillator using capacitively coupled multi-input MOSFETs," Proceedings of 13th Karuizawa workshop on circuits and systems, the Institute of Electronics, Information and Communication Engineers (IEICE), pp. 35–40, 2000.

Reference Document (4): Kinya Matsuda, Yoshihiko Horio, and Kazuyuki Aihara, "Method for high-Q active inductor circuit," Technical Report of IEICE, vol. NLP 2001-39, pp. 37–41, 2001.

Reference document (5) : T. Matsumoto, L. O. Chua, and M. Komuro, "The double scroll," IEEE Trans. on Circuits and Syst., vol. CAS-32, no. 8, pp. 798–817, 1985.

Reference document (6): J. M. Cruz and L. O. Chua, "A CMOS IC nonlinear resistor for Chua's circuit," IEEE Trans. on Circuit and Syst., 1, vol. 39, no. 12, pp. 985–995, 1992.

The inventor of the present invention suggests a conventional nonlinear resistor circuit using the multi-input floating gate MOSFET as one of circuits having a negative voltage-current (V-I) characteristic area (in reference document (1)), and it is applied to an inductor simulation or a sine wave oscillator circuit (in reference documents (2) to (4)). In the circuits, Λ-shaped and V-shaped nonlinear resistor characteristics are realized and further the characteristics are changed by external voltages.

In addition, an N-shaped nonlinear resistor characteristic has the negative resistor area in the center and therefore is widely used for an oscillating circuit or neuron device. In particular, the N-shaped nonlinear resistor characteristic approximates to the piecewise linear characteristics of third to fifth orders can form a sine wave oscillator or a chaos generating circuit by combining L and C (in reference documents (5) and (6)).

DISCLOSURE OF INVENTION

In consideration of the above-mentioned problems, it is one object of the present invention to provide a nonlinear resistor circuit using floating gate MOSFETs for realizing N-shaped V-I characteristics, which enables various N-shaped characteristics approximate to piecewise linear functions of third to seventh orders by applying the nonlinear resistor circuit using the multi-input floating gate MOSFETs and which variously changes the characteristics by the external voltages.

In order to accomplish the above-mentioned object, (1) there is provided a nonlinear resistor circuit using floating gate MOSFETs, wherein a Λ-shaped nonlinear resistor circuit using a multi-input floating gate MOSFET and a V-shaped nonlinear resistor circuit using a multi-input floating gate MOSFET are connected in parallel therewith and current of the Λ-shaped nonlinear resistor circuit and current of the V-shaped nonlinear resistor circuit are added, thus to combine various N-shaped voltage-current characteristics, the N-shaped voltage-current characteristic is continuously changed, and the voltage-current characteristics approximate to the piecewise linear characteristics of third to seventh orders are realized.

(2) In the nonlinear resistor circuit using the floating gate MOSFETs according to the description (1), negative resistor portions in the voltage-current characteristic of the Λ-shaped nonlinear resistor circuit and in the voltage-current characteristic of the V-shaped nonlinear resistor circuit are linear as much as possible, and both the voltage-current characteristic of the Λ-shaped nonlinear resistor circuit and the voltage-current characteristic of the V-shaped nonlinear resistor circuit are moved in parallel in the left and right directions by a voltage between an input terminal of the Λ-shaped nonlinear resistor circuit and a drain terminal of an N-channel MOSFET and a voltage between an input terminal of the V-shaped nonlinear resistor circuit and a drain terminal of a P-channel MOSFET, thus to combine the characteristic of the third order.

(3) In the nonlinear resistor circuit using the floating gate MOSFETs according to the description (1), negative resistor portions in the voltage-current characteristic of the Λ-shaped nonlinear resistor circuit and in the voltage-current characteristic of the V-shaped nonlinear resistor circuit are linear as much as possible, and both the voltage-current characteristic of the Λ-shaped nonlinear resistor circuit and the voltage-current characteristic of the V-shaped nonlinear resistor circuit are moved in parallel in the left and right directions by a voltage between the ground and a drain terminal of a floating gate P-channel MOSFET of the Λ-shaped nonlinear resistor circuit and a voltage between the ground and a drain terminal of a floating gate N-channel MOSFET of the V-shaped nonlinear resistor circuit, thus to combine the characteristic of the third order.

(4) In the nonlinear resistor circuit using the floating gate MOSFETs according to the description (1), an inclination of a negative portion of the voltage-current characteristic of the Λ-shaped nonlinear resistor circuit or the voltage-current characteristic of the V-shaped nonlinear resistor circuit is adjusted to change the inclination of the characteristic, and the voltage-current characteristic of the Λ-shaped nonlinear resistor circuit or the voltage-current characteristic of the V-shaped nonlinear resistor circuit is moved in parallel in the left and right directions by a voltage between an input terminal of the Λ-shaped nonlinear resistor circuit and a drain terminal of an N-channel MOSFET and a voltage between an input terminal of the V-shaped nonlinear resistor circuit and a drain terminal of a P-channel MOSFET, thus to combine the fourth order characteristic.

(5) In the nonlinear resistor circuit using the floating gate MOSFETs according to the description (1), an inclination of a negative portion of the voltage-current characteristic of the Λ-shaped nonlinear resistor circuit or the voltage-current characteristic of the V-shaped nonlinear resistor circuit is adjusted to change the inclination of the characteristic, and the voltage-current characteristic of the Λ-shaped nonlinear resistor circuit or the voltage-current characteristic of the V-shaped nonlinear resistor circuit is moved in parallel in the left and right directions by a voltage between the ground and a drain terminal of a floating gate P-channel MOSFET of the Λ-shaped nonlinear resistor circuit and a voltage between the ground and a drain terminal of a floating gate N-channel MOSFET of the V-shaped nonlinear resistor circuit, thus to combine the fourth order characteristic.

(6) In the nonlinear resistor circuit using the floating gate MOSFETs according to the description (1), inclinations of negative portions of both the voltage-current characteristic of the Λ-shaped nonlinear resistor circuit and the voltage-current characteristic of the V-shaped nonlinear resistor circuit are adjusted to change the inclinations of the characteristics, and both the voltage current characteristic of the Λ-shaped nonlinear resistor circuit and the voltage-current characteristic of the V-shaped nonlinear resistor circuit are moved in parallel in the left and right directions by a voltage between an input terminal of the Λ-shaped nonlinear resistor circuit and a drain terminal of an N-channel MOSFET and a voltage between an input terminal of the V-shaped nonlinear resistor circuit and a drain terminal of a P-channel MOSFET, thus to combine the fifth order characteristic.

(7) In the nonlinear resistor circuit using the floating gate MOSFETs according to the description (1), inclinations of negative portions of both the voltage-current characteristic of the Λ-shaped nonlinear resistor circuit and the voltage-current characteristic of the V-shaped nonlinear resistor circuit are adjusted to change the inclinations of the characteristics, and both the voltage-current characteristic of the Λ-shaped nonlinear resistor circuit and the voltage-current characteristic of the V-shaped nonlinear resistor circuit are moved in parallel in the left and right directions by a voltage between the ground and a drain terminal of a floating gate P-channel MOSFET of the Λ-shaped nonlinear resistor circuit and a voltage between the ground and a drain terminal of a floating gate N-channel MOSFET of the V-shaped nonlinear resistor circuit, thus to combine the fifth order characteristic.

(8) In the nonlinear resistor circuit using the floating gate MOSFETs according to the description (1), an inclination of a negative portion of the voltage-current characteristic of the Λ-shaped nonlinear resistor circuit or the voltage-current characteristic of the V-shaped nonlinear resistor circuit is adjusted to change the inclination of the characteristic, and both the voltage-current characteristic of the Λ-shaped nonlinear resistor circuit and the voltage-current characteristic of the V-shaped nonlinear resistor circuit are moved in parallel in the lateral axis direction by a voltage between an input terminal of the Λ-shaped nonlinear resistor circuit and a drain terminal of an N-channel MOSFET and a voltage between an input terminal of the V-shaped nonlinear resistor circuit and a drain terminal of a P-channel MOSFET, thus to combine the sixth order characteristic.

(9) In the nonlinear resistor circuit using the floating gate MOSFETs according to the description (1), an inclination of a negative portion of the voltage-current characteristic of the Λ-shaped nonlinear resistor circuit or the voltage-current characteristic of the V-shaped nonlinear resistor circuit is adjusted to change the inclination of the characteristic, and both the voltage-current characteristic of the Λ-shaped nonlinear resistor circuit and the voltage-current characteristic of the V-shaped nonlinear resistor circuit are moved in parallel in the lateral axis direction by a voltage between the ground and a drain terminal of a floating gate P-channel MOSFET of the Λ-shaped nonlinear resistor circuit and a voltage between the ground and a drain terminal of a floating gate N-channel MOSFET of the V-shaped nonlinear resistor circuit, thus to combine the sixth order characteristic.

(10) In the nonlinear resistor circuit using the floating gate MOSFETs according to the description (1), inclinations of negative portions of both the voltage-current characteristic of the Λ-shaped nonlinear resistor circuit and the voltage-current characteristic of the V-shaped nonlinear resistor circuit are adjusted to change the inclinations of the characteristics, and both the voltage-current characteristic of the Λ-shaped nonlinear resistor circuit and the voltage-current characteristic of the V-shaped nonlinear resistor circuit are moved in parallel in the lateral axis direction by a voltage between an input terminal of the Λ-shaped nonlinear resistor circuit and a drain terminal of an N-channel MOSFET and a voltage between an input terminal of the V-shaped nonlinear resistor circuit and a drain terminal of a P-channel MOSFET, thus to combine the seventh order characteristic.

(11) In the nonlinear resistor circuit using the floating gate MOSFETs according to the description (1), inclinations of negative portions of both the voltage-current characteristic of the Λ-shaped nonlinear resistor circuit and the voltage-current characteristic of the V-shaped nonlinear resistor circuit are adjusted to change the inclinations of the characteristics, and both the voltage-current characteristic of the Λ-shaped nonlinear resistor circuit and the voltage-current characteristic of the V-shaped nonlinear resistor circuit are moved in parallel in the lateral axis direction by a voltage between the ground and a drain terminal of a floating gate P-channel MOSFET of the Λ-shaped nonlinear resistor circuit and a voltage between the ground and a drain terminal of a floating gate N-channel MOSFET of the V-shaped nonlinear resistor circuit, thus to combine the seventh order characteristic.

BRIEF DESCRIPTION OF THE DRAWINGS

FIGS. 2a–2d are diagrams showing various $V_{xy}$-$I_d$ characteristics (value simulations) in FIG. 1;

FIGS. 3a–3d are diagrams showing various $V_{xy}$-$I_V$ characteristics (value simulations) in FIG. 1;

FIG. 15 is a diagram showing an experimental circuit using discrete parts;

FIG. 16 is a diagram showing the third order $V_{xy}$-$I_N$ characteristic obtained by the experiment using the discrete parts;

FIG. 17 is a diagram showing the fourth order $V_{xy}$-$I_N$ characteristic obtained by the experiment using the discrete parts;

FIG. 18 is a diagram showing the fifth order $V_{xy}$-$I_N$ characteristic obtained by the experiment using the discrete parts;

FIG. 19 is a diagram showing the sixth order $V_{xy}$-$I_N$ characteristic obtained by the experiment using the discrete parts;

FIG. 20 is a diagram showing the seventh order $V_{xy}$-$I_N$ characteristic obtained by the experiment using the discrete parts;

FIG. 21 is a micro-photograph as a substitute drawing showing an IC chip including the circuit shown in FIG. 15;

FIG. 28 is a diagram (No. 7) showing the $V_{xy}$-$I_N$ characteristic measured from the chip.

BEST MODE FOR CARRYING OUT THE INVENTION

Hereinbelow, an embodiment of the present invention will be described with reference to the drawings.

First, an N-shaped nonlinear resistor circuit will be described. Here, a suffix $\Lambda$ is indicated as reference symbol $_A$ for the convenience of indication.

Figure 1:
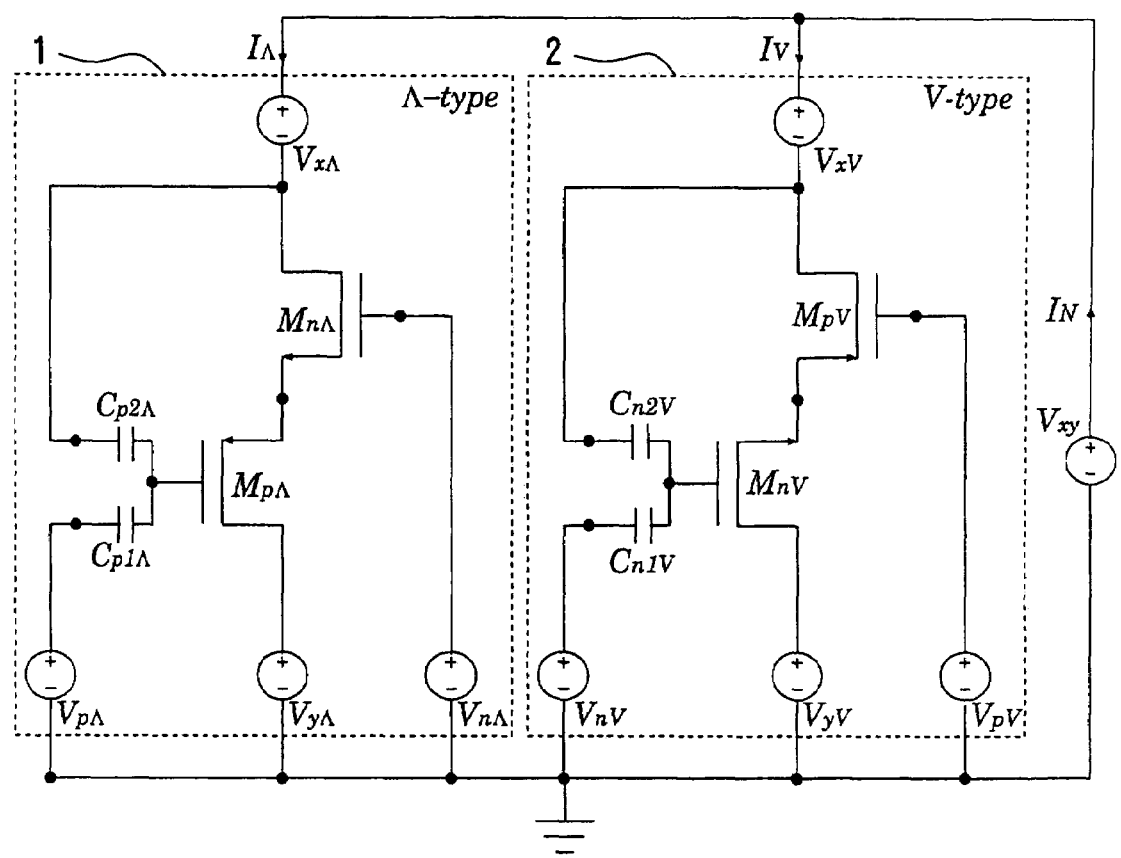
FIG. 1 is a diagram showing an N-shaped nonlinear resistor circuit using floating gate MOSFETs according to the present invention.

FIG. 1 is a diagram showing an N-shaped nonlinear resistor circuit using floating gate MOSFETs according to the present invention. FIG. 2 are diagrams (numerical simulations) showing various $V_{xy}$-$I_A$ characteristics in FIG. 1, FIG. 2(a) is a diagram showing the characteristic with a voltage $V_{xA}$ as a parameter, FIG. 2(b) is a diagram showing the characteristic with a voltage $V_{yA}$ as a parameter, FIG. 2(c) is a diagram showing the characteristic with a voltage $V_{nA}$ as a parameter, and FIG. 2(d) is a diagram showing the characteristic with a voltage $V_{pA}$ as a parameter. FIG. 3 are diagrams (numerical simulations) showing various $V_{xy}$-$I_V$ characteristics in FIG. 1, FIG. 3(a) is a diagram showing the characteristic with a voltage $V_{xV}$ as a parameter, FIG. 3(b) is a diagram showing the characteristic with a voltage $V_{yV}$ as a parameter, FIG. 3(c) is a diagram showing the characteristic with a voltage $V_{nV}$ as a parameter, and FIG. 3(d) is a diagram showing the characteristic with a voltage $V_{pV}$ as a parameter.

Referring to FIG. 1, the circuit is formed by connecting in parallel a $\Lambda$-shaped nonlinear resistor circuit 1 and a V-shaped nonlinear resistor circuit 2 using multi-input floating gate MOSFETs (refer to reference document (1)). FIGS. 2 and 3 show the nonlinear resistor characteristics of the currents $I_A$ and $I_V$, respectively, in FIG. 1 for the voltage $V_{xy}$.

First, the $\Lambda$-shaped nonlinear resistor circuit 1 will be described.

Referring to FIG. 1, at a multi-input floating gate P-channel MOSFET $M_{pA}$, capacitors $C_{p2A}$ and $C_{p1A}$ are connected to a gate terminal of a normal P-channel MOSFET and they are set as input terminals. Inputs are applied via the capacitors $C_{p2A}$ and $C_{p1A}$, thereby equivalently setting the gate terminal of the P-channel MOSFET $M_{pA}$ floating. An N-channel MOSFET $M_{nA}$ is serially connected to the P-channel MOSFET $M_{pA}$.

Next, the V-shaped nonlinear resistor circuit 2 will be described.

Referring to FIG. 1, at the multi-input floating gate N-channel MOSFET $M_{nV}$, capacitors $C_{n1V}$ and $C_{n2V}$ are connected to a gate terminal of a normal N-channel MOSFET and they are set as input terminals. Inputs are applied via the capacitors $C_{n1V}$ and $C_{n2V}$, thereby equivalently setting the gate terminal of the N-channel MOSFET $M_{nV}$ floating. A P-channel MOSFET $M_{pV}$ is serially connected to the N-channel MOSFET $M_{nV}$.

Referring to FIGS. 1 and 2, it is understood that various $V_{xy}$-$I_A$ and $V_{xy}$-$I_V$ characteristics are obtained depending on the voltages shown in FIG. 1 (refer to the reference document (1)). In the circuit shown in FIG. 1, currents $I_A$ and $I_V$ are added, thereby combining various N-shaped $V_{xy}$-$I_N$ characteristics.

A theoretical formula for describing the characteristics for control voltages of $I_A$ and $I_V$ is shown in the reference document (1). Here, the characteristics are simply expressed as follows.

$$I_A = f_A(V_{xy}, V_{xA}, V_{yA}, V_{nA}, V_{pA}), \quad (1)$$

$$I_V = f_V(V_{xy}, V_{xV}, V_{yV}, V_{nV}, V_{pV}), \quad (2)$$

Then, referring to FIG. 1, $$\begin{aligned} I_N &= I_A + I_V \\ &= f_A(V_{xy}, V_{xA}, V_{yA}, V_{nA}, V_{pA}) + \\ &\quad f_V(V_{xy}, V_{xV}, V_{yV}, V_{nV}, V_{pV}) \end{aligned} \quad (3)$$

Figure 4:
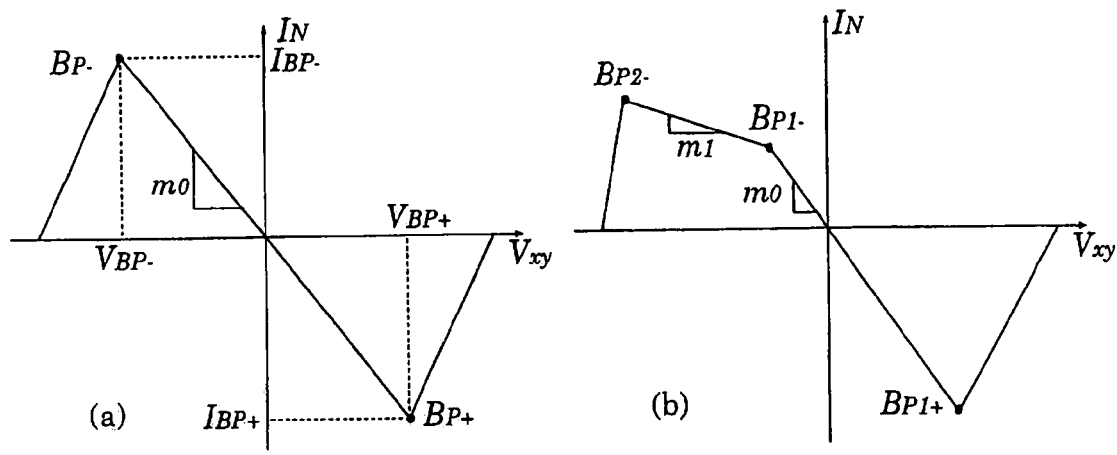
FIGS. 4a–4e are diagrams showing V-I characteristics approximate to a piecewise linearity according to the present invention.
Figure 4:
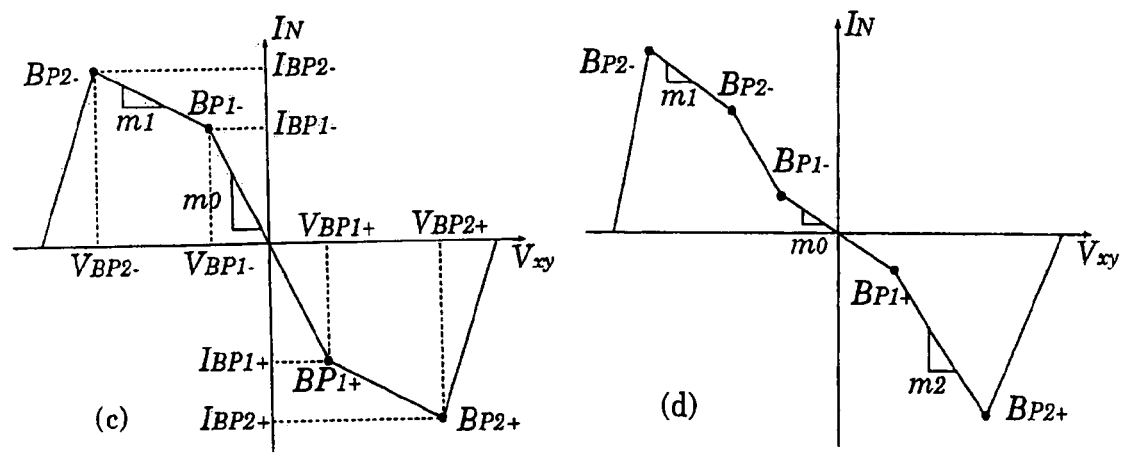
Figure 4:
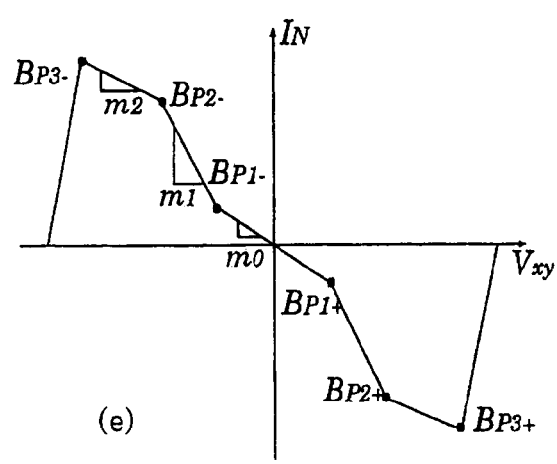

FIG. 4 are diagrams showing V-I characteristics approximate to a piecewise linearity according to the present invention. FIG. 4(a) shows the characteristic of the third order, FIG. 4(b) shows the characteristic of the fourth order, FIG. 4(c) shows the characteristic of the fifth order, FIG. 4(d) shows the characteristic of the sixth order, and FIG. 4(e) shows the characteristic of the seventh order.

The $V_{xy}$-$I_N$ characteristics obtained in FIG. 1 continuously change. In the following, these characteristics are approximate to the characteristics of the piecewise linear functions of the third to seventh orders as shown in FIG. 4 and they are described. Here, the number of piecewise linear sections is called an order. Further, the end point in the piecewise linear section is called a break point.

A simple and qualitative description is given of a method for realizing each characteristic shown in FIG. 4.

Figure 5:
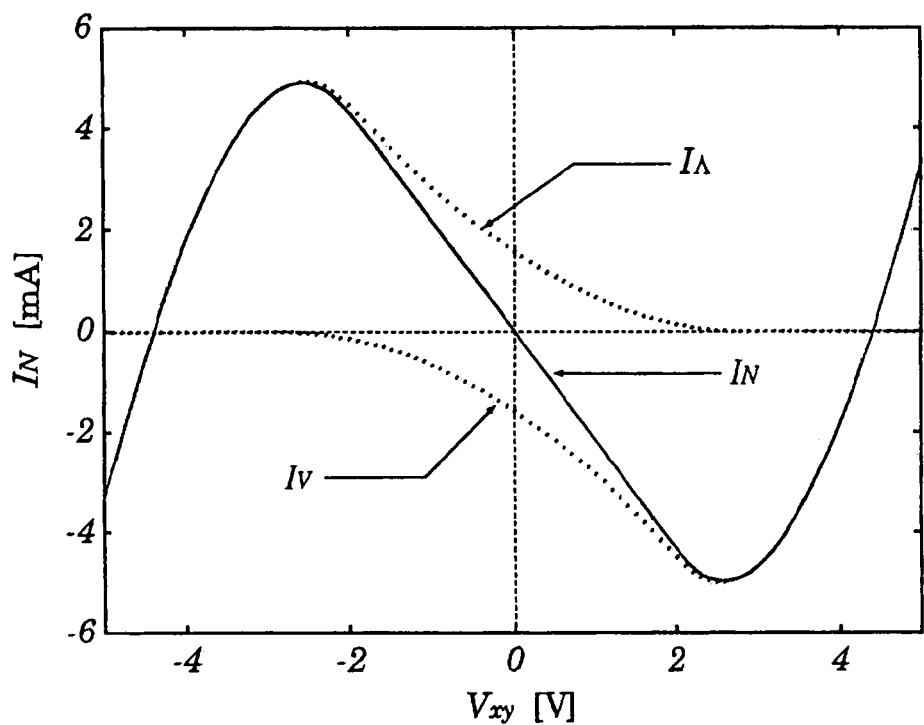
FIG. 5 is a principle diagram of the combination of the N-shaped V-I characteristics of the third order according to the present invention.

First, the characteristic of the third order shown in FIG. 4(a) is obtained by moving in parallel in the left and right directions the $V_{xy}$-$I_A$ and $V_{xy}$-$I_V$ characteristics shown in FIGS. 2 and 3 by the voltage $V_{xA}$ or $V_{yA}$ and the voltage $V_{xV}$ or $V_{yV}$ shown in FIG. 1. In this case, the center portion of the $V_{xy}$-$I_N$ characteristic may entirely be one linear piecewise. In order to realize this, preferably, the negative portions of the Λ-shaped and V-shaped characteristics may be linear as much as possible. That is, the setting of $V_{nA}$, $V_{pA}$, $V_{nV}$, and $V_{pV}$ is important. This state is shown in FIG. 5.

Similarly to the above description, the fourth to seventh characteristics are realized. These characteristics are different from the characteristics of the third order and the break point is necessary for the center portion of the characteristics. This is realized by adjusting the voltage $V_{pA}$ and $V_{nV}$ in FIG. 1. The fourth order characteristic is realized by adjusting the inclination of the negative portion of the $V_{xy}$-$I_A$ or $V_{xy}$-$I_V$ characteristic. The fifth order characteristic is realized by simultaneously adjusting both the Λ-shaped and V-shaped characteristics. The sixth order characteristic is realized by moving in parallel in the lateral axis direction the Λ-shaped and V-shaped characteristics used for the fourth order characteristic by the voltage $V_{xA}$ or $V_{yA}$ and the voltage $V_{xV}$ or $V_{yV}$ in FIG. 1. The seventh order characteristic is obtained by the same method based on the fifth order characteristic.

In the characteristics of the third to seventh orders, the inclination of the piecewise linear function and the break points may be changed. This will be described in detail with the characteristics of the third and fifth orders that are usually used.

(1) Characteristic of the Third Order

By the following method, current-axis coordinates $I_{BP-}$ and $I_{BP+}$ of the break points in FIG. 4(a) are fixed and voltage-axis coordinates $V_{BP-}$ and $V_{BP+}$ are changed. Thus, only an inclination $m_0$ is changed. First, the voltages $V_{BP-}$ and $V_{BP+}$ are determined by the voltage $V_{xA}$ or $V_{yA}$ and the voltage $V_{xV}$ or $V_{yV}$. Next, the currents $I_{BP-}$ and $I_{BP+}$ are adjusted by the voltages $V_{nA}$, $V_{pA}$, $V_{nV}$, and $V_{pV}$ without changing the voltages $V_{BP-}$ and $V_{BP+}$, and the inclination $m_0$ is determined. In this case, since the currents $I_{BP-}$ and $I_{BP+}$ need to be fixed, particularly, the voltages $V_{pA}$ and $V_{nV}$ are important parameters.

Next, a method for adjusting break points $B_{P-}$ and $B_{P+}$ while fixing the inclination $m_0$ is shown. First, the voltages $V_{BP-}$ and $V_{BP+}$ are determined by the voltages $V_{xA}$ or $V_{yA}$ and the voltage $V_{xV}$ or $V_{yV}$. Next, the break points $B_{P-}$ and $B_{P+}$ are enlarged or reduced in the voltage axis direction mainly by the voltages $V_{nA}$ and $V_{pV}$, thus to shift the break points.

(2) Fifth Order Characteristic

For the fifth order characteristic, four break points $B_{P1-}$, $B_{P1+}$, $B_{P2-}$, and $B_{P2+}$ are fixed in FIG. 4(c), and the inclinations $m_0$ and $m_1$ can be adjusted. In the change of only the inclination $m_0$, the change of inclination of the negative resistor portions of the Λ-shaped and V-shaped characteristics are used. Therefore, the voltages $V_{pA}$ and $V_{nV}$ are important parameters. The inclination $m_1$ can be adjusted by the voltages $V_{yA}$ and $V_{yV}$. After that, other voltages adjust the break points.

The break points are changed while fixing the inclinations $m_0$ and $m_1$ as follows. The break point $B_{P1-}$ or $B_{P1+}$ is changed by enlarging the characteristics of the voltages $V_{nA}$ and $V_{pV}$ in the longitudinal axis direction and changing the length of the piecewise linear portion of the inclination $m_1$. Similarly to the change of the break points of the characteristic of the third order, the break point $B_{P2-}$ or $B_{P2+}$ is adjusted by enlarging or reducing the break point $B_{P2-}$ or $B_{P2+}$ in the voltage-axis direction and in the current-axis direction by the voltage $V_{pA}$, $V_{xA}$, or $V_{yA}$ and the voltage $V_{nV}$, $V_{xV}$, or $V_{yV}$. In this case, the fine adjustment with other control voltages is necessary.

[Neumerical Simulations]

Hereinbelow, the N-shaped nonlinear resistor characteristics of the third to seventh orders are confirmed by computer simulations using the V-I characteristic formula using the simple MOSFET-model derived from reference document (1). Particularly, with the characteristics of the third to fifth orders, the adjusting states of the break points and inclinations are indicated in detail. In the simulation experiments, trans-conductance parameters of the N-channel MOSFET and P-channel MOSFET in FIG. 1 are $K_n = K_p = 300$ μA/V$^2$, a threshold voltage of the N-channel MOSFET is $V_{tn} = 0.55$ V, and a threshold voltage of the P-channel MOSFET is $V_{tp} = -0.8$ V. Further, referring to FIG. 1, $C_{p1A} = C_{p2A} = C_{n1V} = C_{n2V} = 0.1$ pF.

(1) Nonlinear Resistor Characteristic of the Third Order

Figure 6:
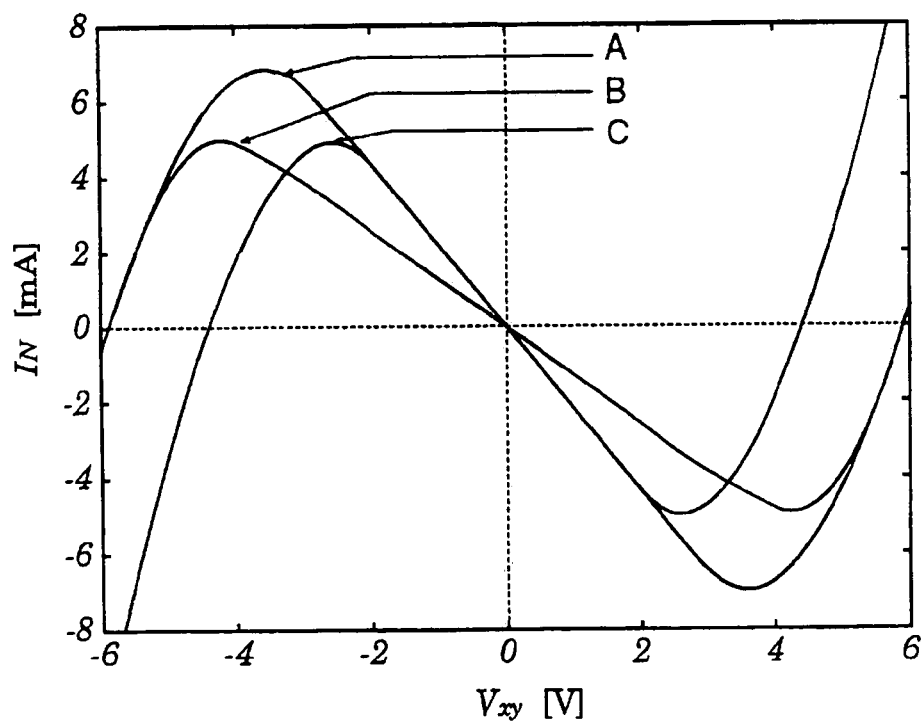
FIG. 6 is a diagram showing examples (numerical simulations) of nonlinear resistor characteristics which are approximate to the piecewise linearity of the third order according to the present invention.

Referring to FIG. 6, the characteristic approximates to the third order piecewise linearity is shown in the case of using the voltage values in Table 1. A characteristic A has the same inclination $m_0$ with a characteristic C in FIG. 6 and the break point of the characteristic A is different from the characteristic C. On the contrary, a characteristic B has the same currents $I_{P1-}$ and $I_{P1+}$ as those of the characteristic C and the inclination $m_0$ of the characteristic B is different from that of the characteristic C. As a result, the break points $B_{P-}$ and $B_{P+}$ and the inclination $m_0$ shown in FIG. 4 are changed.

TABLE 1

| | Characteristics in FIG. 6 | | |
|---|---|---|---|
| Voltages in FIG. 1 | A | B | C |
| $V_{xA}$ [V] | −5.9 | −5.9 | −4.4 |
| $V_{yA}$ [V] | 0 | 0 | 0 |
| $V_{nA}$ [V] | 3.7 | 2.5 | 2.95 |
| $V_{pA}$ [V] | −4.1 | −5.3 | −4.1 |
| $V_{xV}$ [V] | 5.9 | 5.9 | 4.4 |
| $V_{yV}$ [V] | 0 | 0 | 0 |
| $V_{nV}$ [V] | 3.7 | 5.9 | 3.7 |
| $V_{pV}$ [V] | −3.9 | −2.7 | −3.15 |

See Table 1 and FIG. 6, the break points are determined depending on the voltages $V_{nA}$ and $V_{pV}$, and the inclination $m_0$ is greatly changed by the voltages $V_{pA}$ and $V_{nV}$.

(2) Fifth Order Nonlinear Resistor Characteristic

Figure 7:
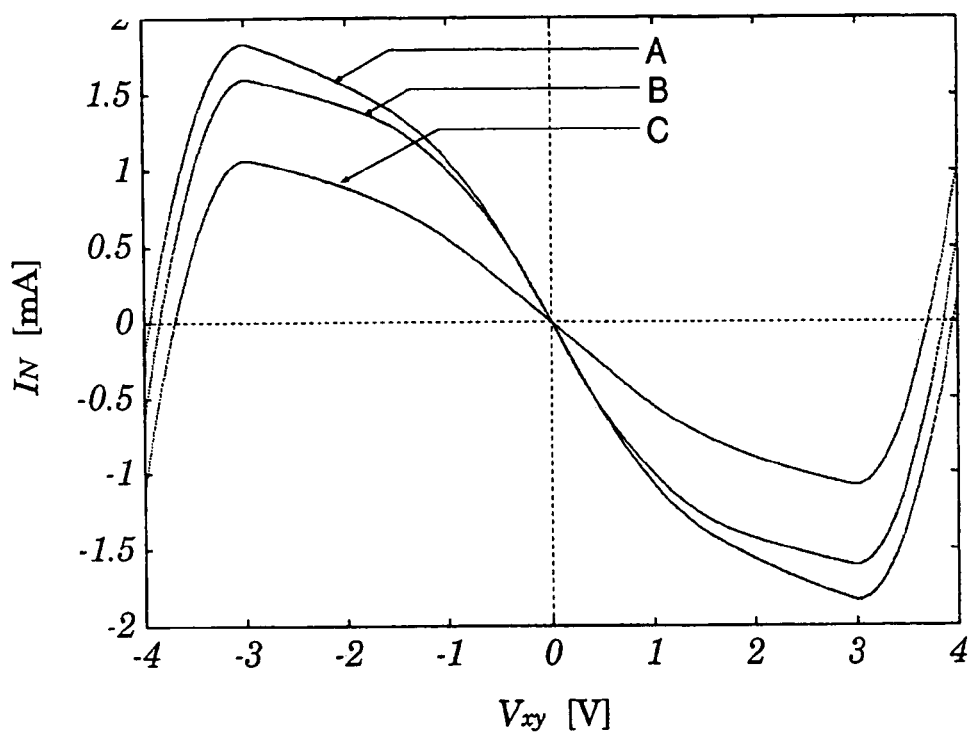
FIG. 7 is a diagram showing an example of the fifth order nonlinear resistor characteristic (in which the voltage coordinate of a break point is fixed and inclinations $m_0$ and $m_1$ are changed) according to the present invention.
Figure 8:
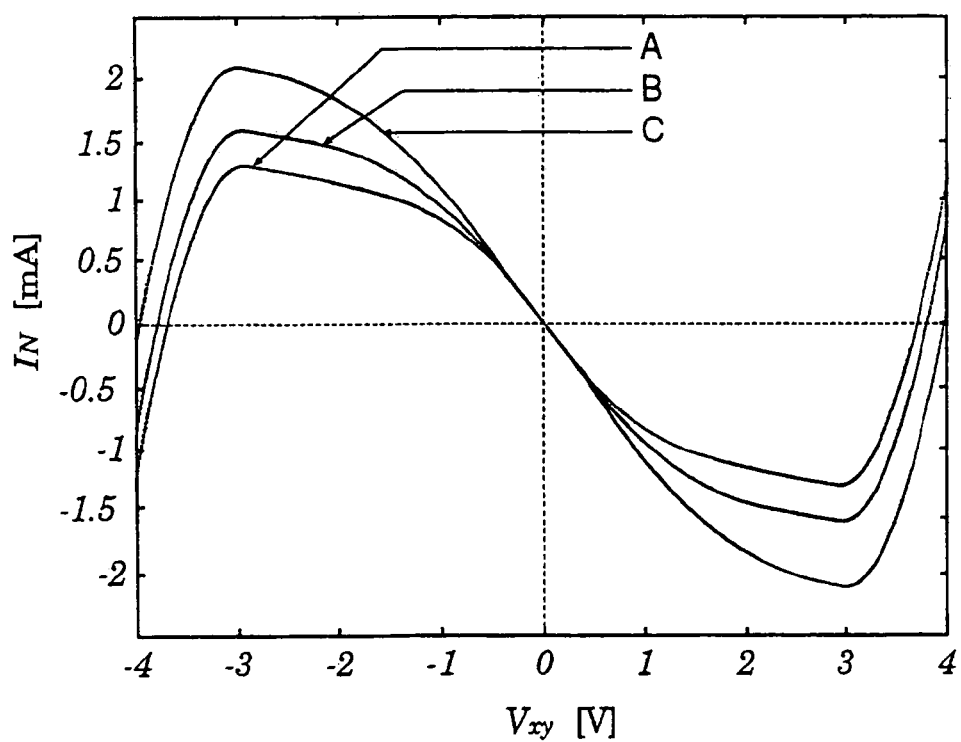
FIG. 8 is a diagram showing an example of the fifth order nonlinear resistor characteristic (in which the inclinations $m_0$ and $m_1$ are fixed, break points $B_{P2-}$ and $B_{P2+}$ are fixed, and break points $B_{P1-}$ and $B_{P1+}$ are changed) according to the present invention.
Figure 9:
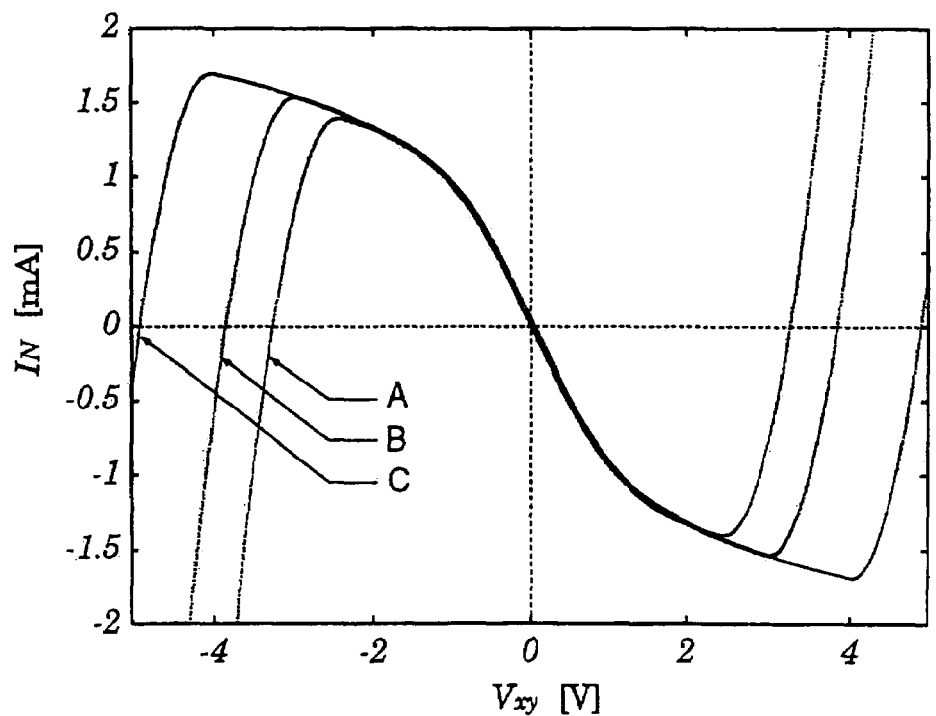
FIG. 9 is a diagram showing an example of the fifth order nonlinear resistor characteristic (in which the inclinations $m_0$ and $m_1$ are fixed, the break points $B_{P1-}$ and $B_{P1+}$ are fixed, and the break points $B_{P2-}$ and $B_{P2+}$ are changed) according to the present invention.

Examples of the $V_{xy}$-$I_N$ characteristic approximates to the fifth order piecewise linear characteristic obtained by the simulation are shown in FIGS. 7, 8, and 9. Further, values of control voltages for the characteristics in FIGS. 7, 8, and 9 are shown in Tables 2 to 4.

TABLE 2

| Voltages in FIG. 1 | Characteristics in FIG. 7 | | |
|---|---|---|---|
|  | A | B | C |
| $V_{xA}$ [V] | −3.95 | −3.95 | −4.05 |
| $V_{yA}$ [V] | 0 | 0.1 | 0.38 |
| $V_{nA}$ [V] | 1.55 | 1.55 | 1.65 |
| $V_{pA}$ [V] | −5.15 | −5.4 | −4.2 |
| $V_{xV}$ [V] | 3.95 | 3.95 | 4.05 |
| $V_{yV}$ [V] | 0 | −0.1 | −0.38 |
| $V_{nV}$ [V] | 4.65 | 4.9 | 3.7 |
| $V_{pV}$ [V] | −1.8 | −1.8 | −1.9 |

TABLE 3

| Voltages in FIG. 1 | Characteristics in FIG. 8 | | |
|---|---|---|---|
|  | A | B | C |
| $V_{xA}$ [V] | −3.7 | −3.9 | −4.1 |
| $V_{yA}$ [V] | 0 | 0.1 | 0.13 |
| $V_{nA}$ [V] | 1.35 | 1.525 | 1.7 |
| $V_{pA}$ [V] | −5 | −5.7 | −6.1 |
| $V_{xV}$ [V] | 3.7 | 3.9 | 4.1 |
| $V_{yV}$ [V] | 0 | −0.1 | −0.13 |
| $V_{nV}$ [V] | 4.7 | 5.2 | 5.6 |
| $V_{pV}$ [V] | −1.6 | −1.775 | −1.95 |

TABLE 4

| Voltages in FIG. 1 | Characteristics in FIG. 9 | | |
|---|---|---|---|
|  | A | B | C |
| $V_{xA}$ [V] | −3.4 | −3.95 | −5 |
| $V_{yA}$ [V] | 0.135 | 0.1 | 0.1 |
| $V_{nA}$ [V] | 1.535 | 1.55 | 1.55 |
| $V_{pA}$ [V] | −4.93 | −5 | −6.1 |
| $V_{xV}$ [V] | 3.4 | 3.95 | 5 |
| $V_{yV}$ [V] | −0.135 | −0.1 | −0.1 |
| $V_{nV}$ [V] | 4.43 | 4.5 | 5.5 |
| $V_{pV}$ [V] | −1.765 | −1.8 | −1.8 |

TABLE 5

Figure 10:
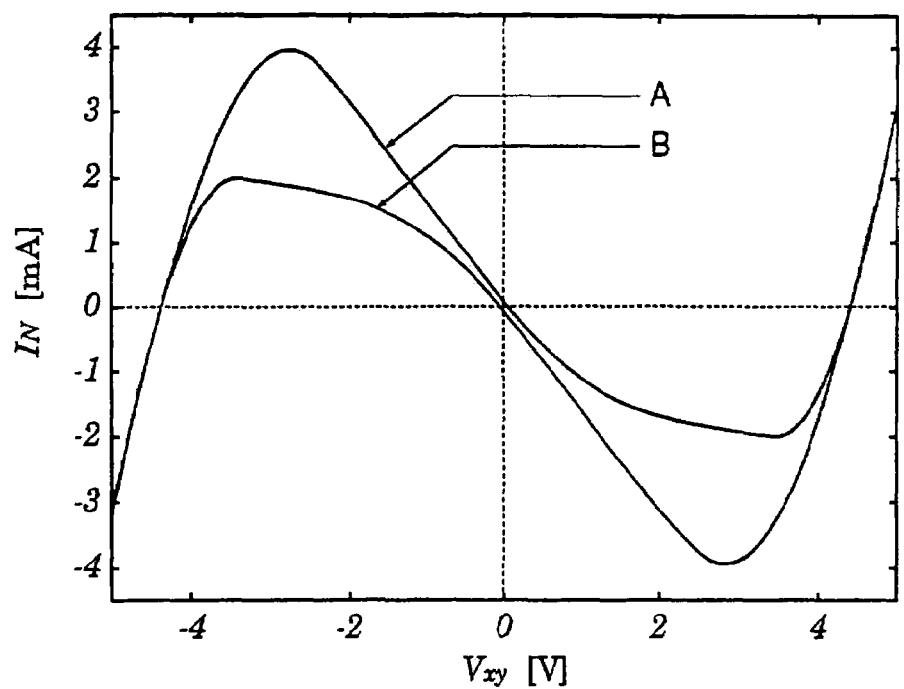
FIG. 10 is a diagram showing an example of the fourth order nonlinear resistor characteristic according to the present invention.

| Voltages in FIG. 1 | Characteristics in FIG. 10 | |
|---|---|---|
|  | A | B |
| $V_{xA}$ [V] | −4.4 | −4.4 |
| $V_{yA}$ [V] | 0 | 0 |
| $V_{nA}$ [V] | 2.6 | 1.55 |
| $V_{pA}$ [V] | −4 | −6 |
| $V_{xV}$ [V] | 4.4 | 4.4 |
| $V_{yV}$ [V] | 0 | 0 |
| $V_{nV}$ [V] | 5.5 | 3.7 |
| $V_{pV}$ [V] | −1.8 | −2.75 |

TABLE 6

Figure 11:
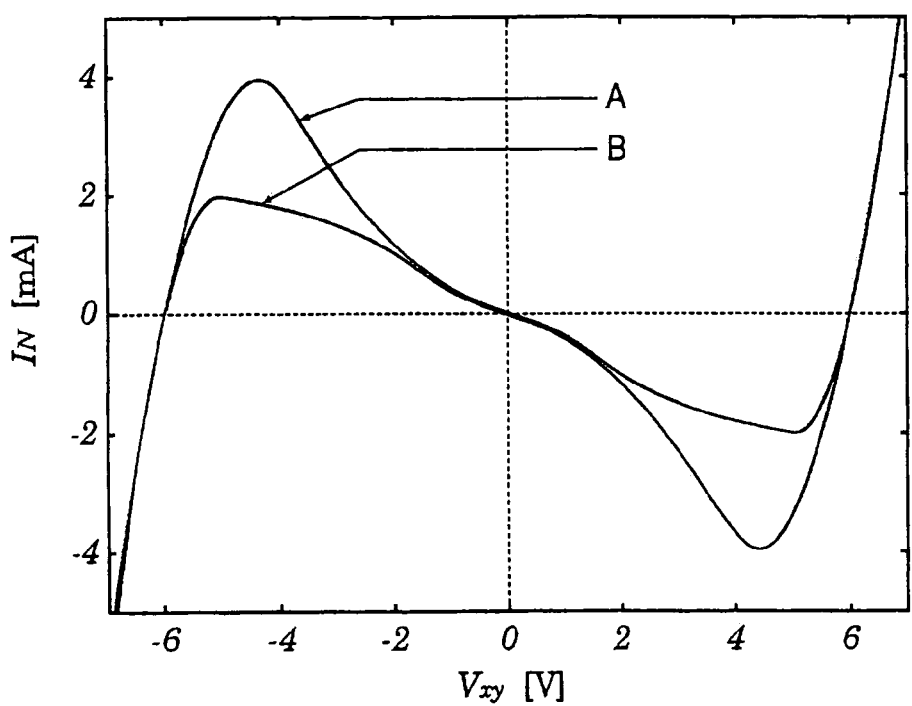
FIG. 11 is a diagram showing an example of the sixth order nonlinear resistor characteristic according to the present invention.

| Voltages in FIG. 1 | Characteristics in FIG. 11 | |
|---|---|---|
|  | A | B |
| $V_{xA}$ [V] | −6 | −6 |
| $V_{yA}$ [V] | 0 | 0 |
| $V_{nA}$ [V] | 2.6 | 1.55 |
| $V_{pA}$ [V] | −4 | −6 |
| $V_{xV}$ [V] | 6 | 6 |
| $V_{yV}$ [V] | 0 | 0 |
| $V_{nV}$ [V] | 5.5 | 3.7 |
| $V_{pV}$ [V] | −1.8 | −2.75 |

TABLE 7

| Voltages in FIG. 1 | |
|---|---|
| $V_{xA}$ [V] | −5.5 |
| $V_{yA}$ [V] | 0.1 |
| $V_{nA}$ [V] | 1.55 |
| $V_{pA}$ [V] | −5.4 |
| $V_{xV}$ [V] | 5.5 |
| $V_{yV}$ [V] | −0.1 |
| $V_{nV}$ [V] | 4.9 |
| $V_{pV}$ [V] | −1.8 |

Curves B and C in FIG. 7 are shown as examples by changing the inclination $m_0$ with the fixing of the voltage coordinates of the four break points in FIG. 4(c). Similarly, curves A and B are shown by changing the inclination $m_1$ as examples. Based on the examples and Table 2, the voltages $V_{pA}$ and $V_{nV}$ may be changed while keeping the voltages $V_{nA}$ and $V_{pV}$ constant in the case of adjusting the inclination $m_0$. Further, the inclination $m_1$ may be adjusted by coarsely determining the characteristic with the voltages $V_{yA}$ and $V_{yV}$, and by using the voltages $V_{pA}$ and $V_{nV}$ for fine tuning.

FIG. 8 and Table 3 show an example of adjusting the break points $B_{P1-}$ and $B_{P1+}$ while fixing the inclinations $m_0$ and $m_1$ in FIG. 4(c). FIG. 9 and Table 4 show an example of adjusting the break points $B_{P2-}$ and $B_{P2+}$. Based on the simulation experiments, the break points $B_{P1+}$ and $B_{P1-}$ are determined depending on the voltages $V_{pV}$ and $V_{nA}$, respectively. Further, the break points $B_{P2+}$ and $B_{P2-}$ are determined depending on the voltages $V_{xV}$ and $V_{nV}$ and the voltages $V_{xA}$ and $V_{pA}$, respectively.

(3) Fourth, Sixth, and Seventh Order Nonlinear Resistor Characteristics

Figure 12:
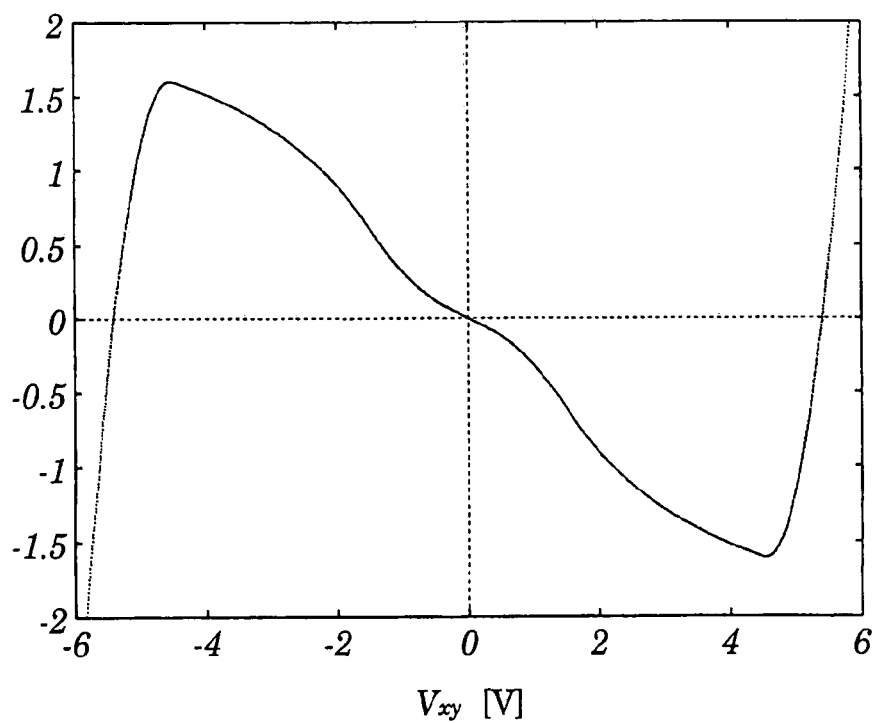
FIG. 12 is a diagram showing an example of the seventh order nonlinear resistor characteristic according to the present invention.

FIG. 10 shows the fourth order nonlinear resistor characteristic, FIG. 11 shows the sixth order nonlinear resistor characteristic, and FIG. 12 shows the seventh order nonlinear resistor characteristic. The voltages in FIG. 1 used for the characteristics are shown in Tables 5 to 7.

With Table 5 and C in Table 1, the fourth order characteristic is obtained by changing the voltages $V_{nA}$, $V_{pA}$, $V_{nV}$, and $V_{pV}$ based on the characteristic of the third order. Further, with Tables 5 and 6, Table 7, and B in Table 2, the sixth and seventh order characteristics are obtained by changing the voltages $V_{xA}$ and $V_{xV}$ based on the fourth and fifth order characteristics, respectively.

[HSPICE Simulations]

Figure 13:
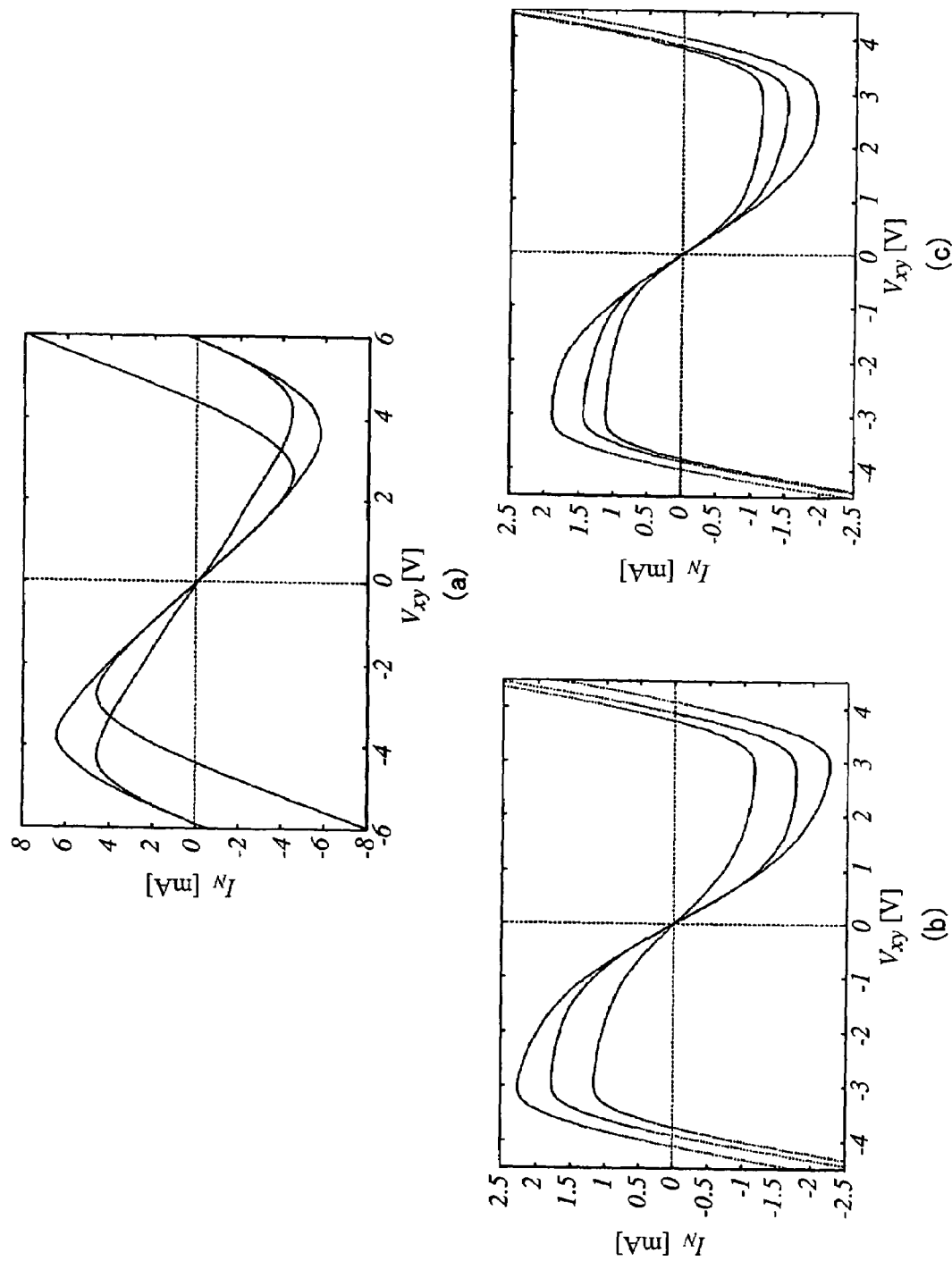
FIGS. 13a–13c are diagrams (No. 1) showing circuit simulation results using HSPICE.
Figure 14:
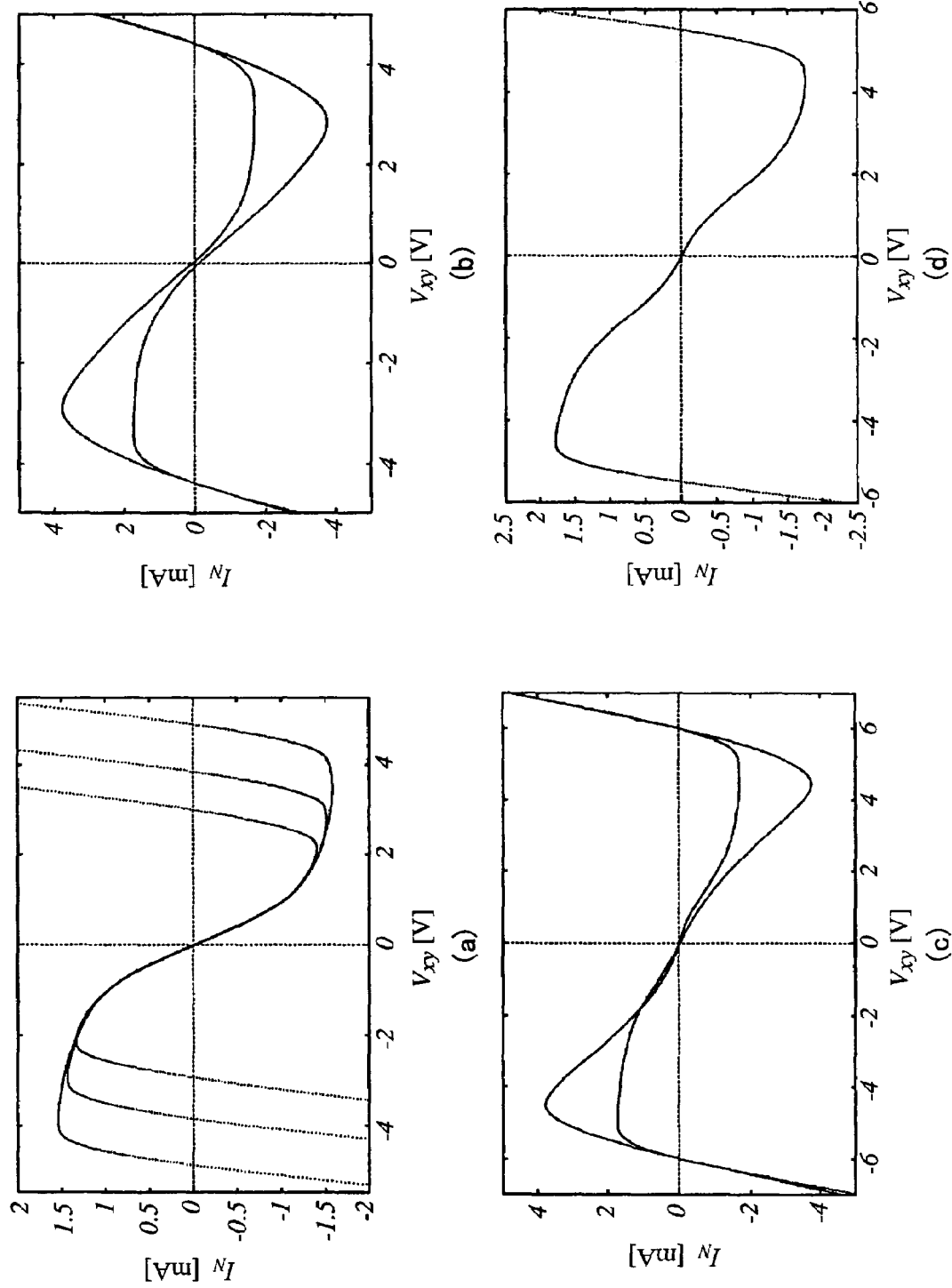
FIGS. 14a–14d are diagrams (No. 2) showing the circuit simulation results using HSPICE.

Semiconductor process parameters of MOSIS TSMC 0.35 µm CMOS process is used, and the sizes of $M_{nA}$ and $M_{nV}$ in FIG. 1 have W of 20 µm and L of 0.4 µm. Further, the sizes of $M_{pA}$ and $M_{pV}$ in FIG. 1 have W of 60 µm and L of 0.4 µm. FIGS. 13 and 14 show results of circuit simulations using HSPICE in the case of capacitances $C_{p1A}=C_{p2A}=C_{n1V}=C_{n2V}=0.1$ pF. The characteristics correspond to the simulation characteristics of the third to seventh orders, respectively.

As mentioned above, the N-shaped nonlinear resistor circuit is provided with the multi-input floating gate MOSFETs. Further, the numeral calculations and the HSPICE simulations are used to show examples of the V-I characteristics. Further, a method for realizing the characteristics is qualitatively described.

[Experiments Using Discrete Parts]

According to the embodiment, the circuit in FIG. 15 comprises discrete parts, and the $V_{xy}$-$I_N$ characteristic is measured. The circuit is shown in FIG. 15. $M_{nA}$11 and $M_{nV}$12 use 2SK612 and $M_{pA}$13 and $M_{pV}$14 use 2SJ133. Further, experimental results are shown in FIGS. 16 to 20 when capacitances $C_{p1A}$15, $C_{p2A}$16, $C_{n1V}$17, and $C_{n2V}$18 are 0.1 µF. The voltage values in FIG. 15 for realizing the characteristics are shown in Tables 8 to 12.

FIG. 16 shows the experimental results using the discrete parts of the $V_{xy}$-$I_N$ characteristic of the third order, and voltage values in FIG. 15 are $V_A$ of −0.7V, $V_{nA}$ of 1.55V, $V_{pA}$ of −4.69V, $V_V$ of 0.7V, $V_{nV}$ of 3.23V, and $V_{pV}$ of −2.32V as shown in Table 8.

TABLE 8

| Voltages in FIG. 15 | |
|---|---|
| $V_A$ [V] | −0.7 |
| $V_{nA}$ [V] | 1.55 |
| $V_{pA}$ [V] | −4.69 |
| $V_V$ [V] | 0.7 |
| $V_{nV}$ [V] | 3.23 |
| $V_{pV}$ [V] | −2.32 |

FIG. 17 shows the experimental results using the discrete parts of the fourth order $V_{xy}$-$I_N$ characteristic, and voltage values in FIG. 15 are $V_A$ of −1.6V, $V_{nA}$ of 1.46V, $V_{pA}$ of −5.65V, $V_V$ of 1V, $V_{nV}$ of 3.43V, and $V_{pV}$ of −2.28V as shown in Table 9.

TABLE 9

| Voltages in FIG. 15 | |
|---|---|
| $V_A$ [V] | −1.6 |
| $V_{nA}$ [V] | 1.46 |
| $V_{pA}$ [V] | −5.65 |
| $V_V$ [V] | 1 |
| $V_{nV}$ [V] | 3.43 |
| $V_{pV}$ [V] | −2.28 |

FIG. 18 shows the experimental results using the discrete parts of the fifth order $V_{xy}$-$I_N$ characteristic, and voltage values in FIG. 15 are $V_A$ of −1.5V, $V_{nA}$ of 1.46V, $V_{pA}$ of −5.65V, $V_V$ of 1.5V, $V_{nV}$ of 4.23V, and $V_{pV}$ of −2.18V as shown in Table 10.

TABLE 10

| Voltages in FIG. 15 | |
|---|---|
| $V_A$ [V] | −1.5 |
| $V_{nA}$ [V] | 1.46 |
| $V_{pA}$ [V] | −5.65 |
| $V_V$ [V] | 1.5 |
| $V_{nV}$ [V] | 4.23 |
| $V_{pV}$ [V] | −2.18 |

FIG. 19 shows the experimental results using the discrete parts of the sixth order $V_{xy}$-$I_N$ characteristic, and voltage values in FIG. 15 are $V_A$ of −2.1V, $V_A$ of 1.46V, $V_{pA}$ of −5.65V, $V_V$ of 1.6V, $V_{nV}$ of 3.43V, and $V_{pV}$ of −2.28V as shown in Table 11.

TABLE 11

| Voltages in FIG. 15 | |
|---|---|
| $V_A$ [V] | −2.1 |
| $V_{nA}$ [V] | 1.46 |
| $V_{pA}$ [V] | −5.65 |
| $V_V$ [V] | 1.6 |
| $V_{nV}$ [V] | 3.43 |
| $V_{pV}$ [V] | −2.28 |

FIG. 20 shows the experimental results using the discrete parts of the seventh order $V_{xy}$-$I_N$ characteristic, and voltage values in FIG. 15 are $V_A$ of −2.1V, $V_{nA}$ of 1.46V, $V_{pA}$ of −5.65V, $V_V$ of 2.1V, $V_{nV}$ of 4.23V, and $V_{pV}$ of −2.18V as shown in Table 12.

TABLE 12

| Voltages in FIG. 15 | |
|---|---|
| $V_A$ [V] | −2.1 |
| $V_{nA}$ [V] | 1.46 |
| $V_{pA}$ [V] | −5.65 |
| $V_V$ [V] | 2.1 |
| $V_{nV}$ [V] | 4.23 |
| $V_{pV}$ [V] | −2.18 |

A resistor R(19) is inserted between nodes A and B (on the power supply side of the above-mentioned nonlinear resistor circuit) in FIG. 15, the voltage drop is amplified by an instrumentation amplifier (INA114) 20, and the current $I_N$ is obtained based on the amplified output voltages by the following formulae (4) to (6). Here, reference symbol $R_G$ denotes resistance for determining gain G of the instrumentation amplifier 20, and $R_G$ is 10 kΩ. Further, the resistance R is 33 Ω and output resistance $R_o$ is 10 kΩ.

$$Vo = G \cdot (V_{IN}^+ - V_{IN}^-) \quad (4)$$

$$G = I + (50\ k\Omega/R_G) \quad (5)$$

$$I_N = V_o/G \cdot R \quad (6)$$

Next, an example of an integrated circuit will be described.

The circuit shown in FIG. 15 is an integrated circuit fabricated through MOSIS TSMC 0.35 µm CMOS semiconductor process. The $V_{xy}$-$I_N$ characteristic measuring circuit comprising the resistor 19 and the measuring amplifier shown in FIG. 15 is not integrated and is mounted outside of the chip by discrete parts. FIG. 21 shows a microphotograph of the IC chip including the circuit shown in FIG. 15.

The sizes of $M_{nA}$ and $M_{nV}$ in FIG. 15 have W of 18 µm and L of 0.6 µm. Further, the sizes of $M_{pA}$ and $M_{pV}$ in FIG. 15 have W of 54 µm and L of 0.6 µm. Furthermore, the capacitances are $C_{p1A} = C_{p2A} = C_{n1V} = C_{n2V} = 0.3$ pF.

FIGS. 22 to 28 show the $V_{xy}$-$I_N$ characteristics which are measured from the chip. The voltage values in FIG. 15 for realizing the characteristics are shown in Tables 13 to 19. The characteristics correspond to the simulation characteristics of the third to seventh orders and the HSPICE simulation characteristics. Here, the current $I_N$ is obtained by the calculating formulae (4), (5), and (6), similarly to the experiment using discrete parts. The resistances in the calculating formulae (4), (5), and (6) are $R_G$ of 240 kΩ, R of 10 Ω, and output resistance $R_o$ of 10 kΩ.

TABLE 13

Figure 22:
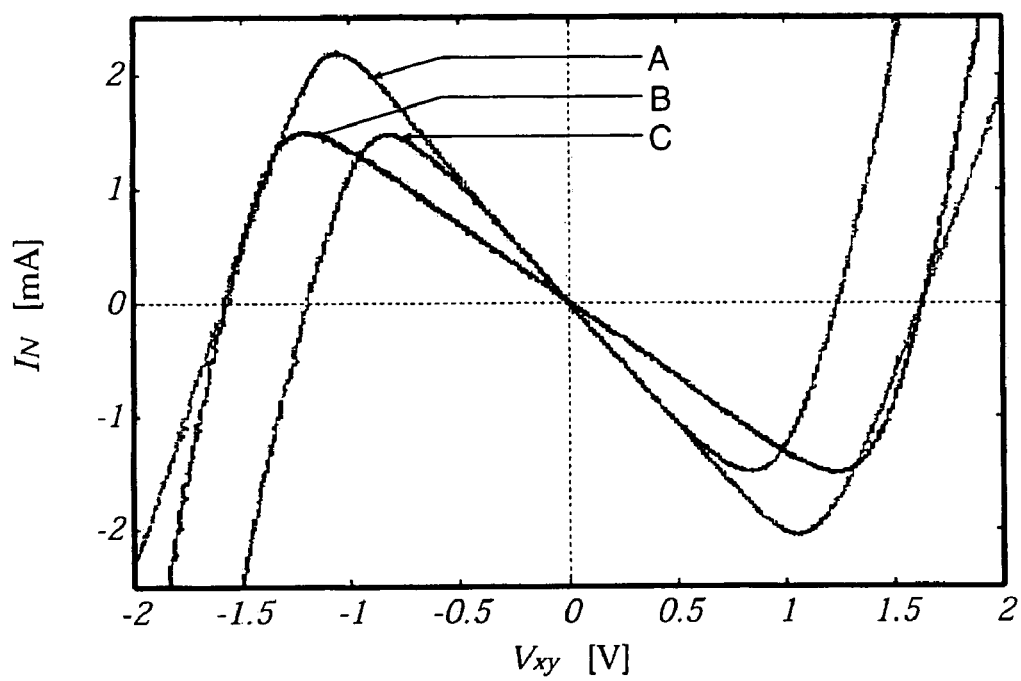
FIG. 22 is a diagram (No. 1) showing a $V_{xy}$-$I_N$ characteristic measured from a chip.

| | Characteristics in FIG. 22 | | |
|---|---|---|---|
| Voltages in FIG. 15 | A | B | C |
| $V_A$ [V] | −1.65 | −1.65 | −1.45 |
| $V_{nA}$ [V] | 1.18 | 1.11 | 1.42 |
| $V_{pA}$ [V] | −8.75 | −8.97 | −8.27 |
| $V_V$ [V] | 1.65 | 1.65 | 1.45 |
| $V_{nV}$ [V] | 7.76 | 7.96 | 7.06 |
| $V_{pV}$ [V] | −1.35 | −1.35 | −1.62 |

TABLE 14

Figure 23:
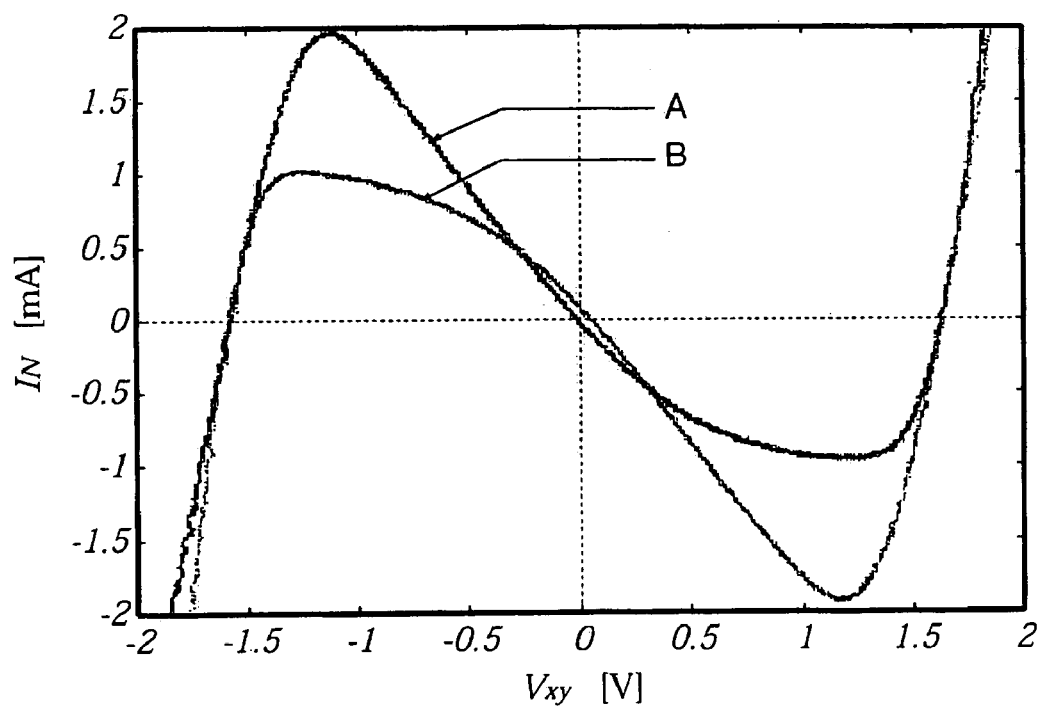
FIG. 23 is a diagram (No. 2) showing the $V_{xy}$-$I_N$ characteristic measured from the chip.

| | Characteristics in FIG. 23 | |
|---|---|---|
| Voltages in FIG. 15 | A | B |
| $V_A$ [V] | −1.65 | −1.65 |
| $V_{nA}$ [V] | 0.77 | 0.64 |
| $V_{pA}$ [V] | −8.17 | −9.8 |
| $V_V$ [V] | 1.65 | 1.65 |
| $V_{nV}$ [V] | 8.82 | 7.25 |
| $V_{pV}$ [V] | −0.81 | −0.9 |

TABLE 15

Figure 24:
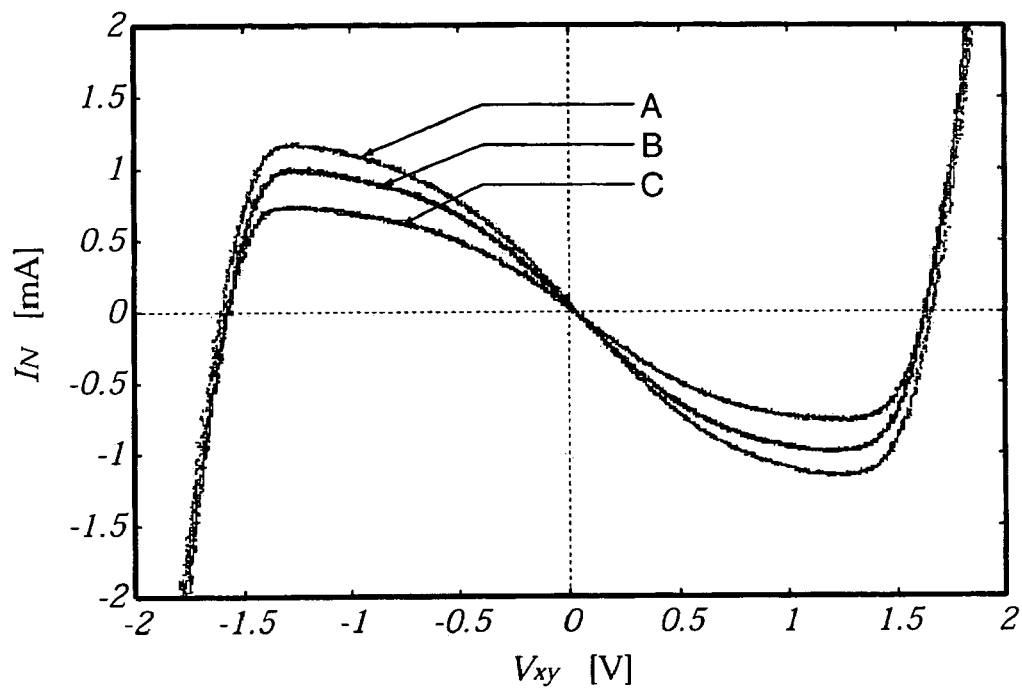
FIG. 24 is a diagram (No. 3) showing the $V_{xy}$-$I_N$ characteristic measured from the chip.

| | Characteristics in FIG. 24 | | |
|---|---|---|---|
| Voltages in FIG. 15 | A | B | C |
| $V_A$ [V] | −1.59 | −1.65 | −1.65 |
| $V_{nA}$ [V] | 0.87 | 0.86 | 0.89 |
| $V_{pA}$ [V] | −9.4 | −9.4 | −9 |
| $V_V$ [V] | 1.59 | 1.65 | 1.65 |
| $V_{nV}$ [V] | 8.26 | 8.26 | 7.86 |
| $V_{pV}$ [V] | −1.02 | −1.02 | −1.06 |

TABLE 16

Figure 25:
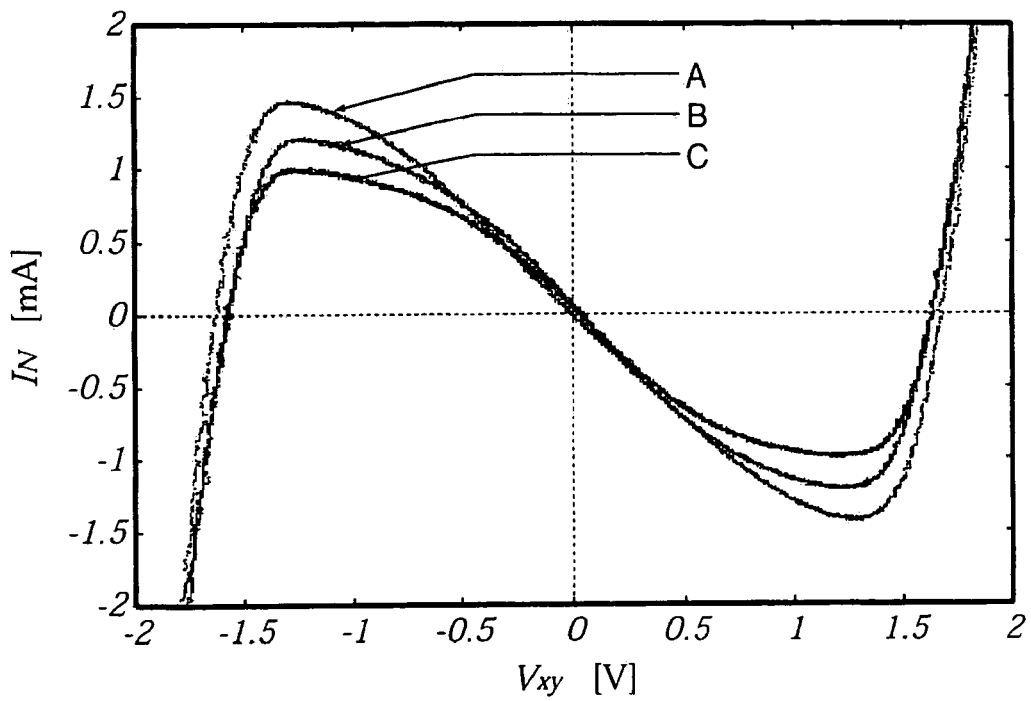
FIG. 25 is a diagram (No. 4) showing the $V_{xy}$-$I_N$ characteristic measured from the chip.

| | Characteristics in FIG. 25 | | |
|---|---|---|---|
| Voltages in FIG. 15 | A | B | C |
| $V_A$ [V] | −1.65 | −1.65 | −1.45 |
| $V_{nA}$ [V] | 0.86 | 0.92 | 0.96 |
| $V_{pA}$ [V] | −9.4 | −9.4 | −9 |
| $V_V$ [V] | 1.65 | 1.65 | 1.65 |
| $V_{nV}$ [V] | 8.26 | 8.26 | 7.86 |
| $V_{pV}$ [V] | −1.02 | −1.09 | −1.14 |

TABLE 17

Figure 26:
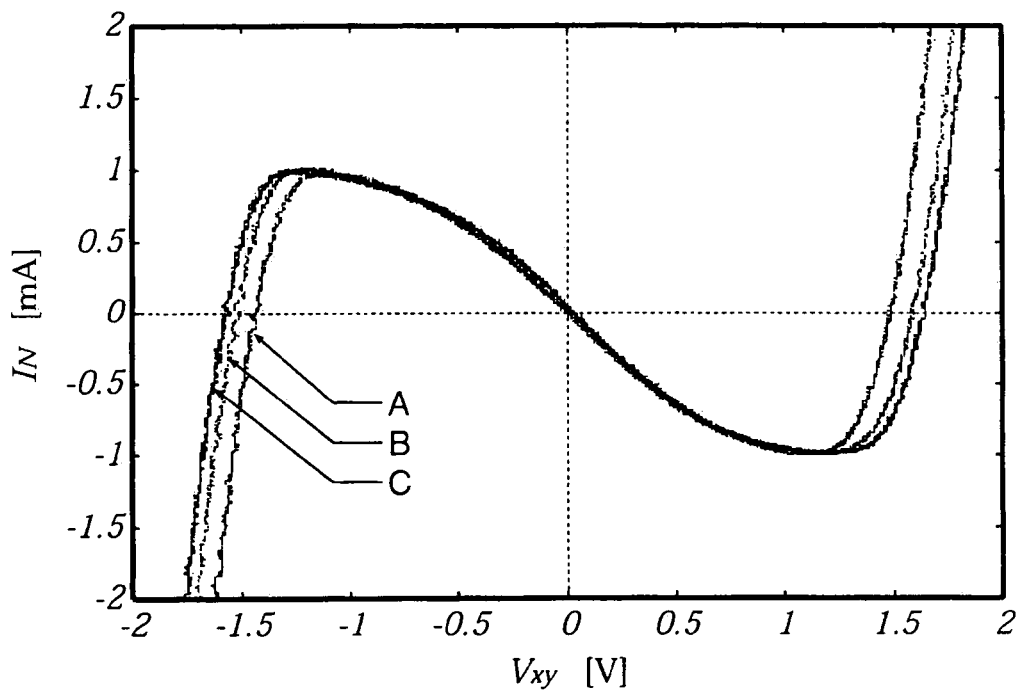
FIG. 26 is a diagram (No. 5) showing the $V_{xy}$-$I_N$ characteristic measured from the chip.

| | Characteristics in FIG. 26 | | |
|---|---|---|---|
| Voltages in FIG. 15 | A | B | C |
| $V_A$ [V] | −1.45 | −1.55 | −1.65 |
| $V_{nA}$ [V] | 1.12 | 0.97 | 0.86 |
| $V_{pA}$ [V] | −8.81 | −9.54 | −9.4 |
| $V_V$ [V] | 1.45 | 1.55 | 1.65 |
| $V_{nV}$ [V] | 7.6 | 8.28 | 8.26 |
| $V_{pV}$ [V] | −1.29 | −1.15 | −1.02 |

TABLE 18

Figure 27:
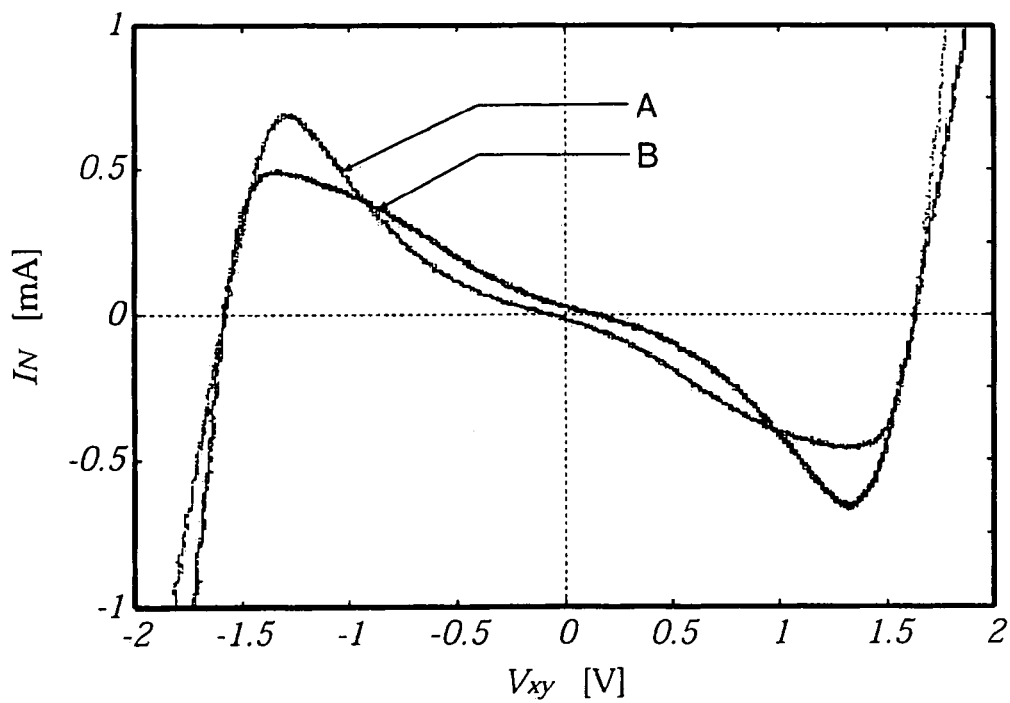
FIG. 27 is a diagram (No. 6) showing the $V_{xy}$-$I_N$ characteristic measured from the chip.

| | Characteristics in FIG. 27 | |
|---|---|---|
| Voltages in FIG. 15 | A | B |
| $V_A$ [V] | −1.65 | −1.65 |
| $V_{nA}$ [V] | 0.77 | 0.64 |
| $V_{pA}$ [V] | −8.17 | −8.86 |
| $V_V$ [V] | 1.65 | 1.65 |
| $V_{nV}$ [V] | 7.79 | 7.25 |
| $V_{pV}$ [V] | −0.81 | −0.9 |

TABLE 19

| Voltages in FIG. 15 | |
|---|---|
| $V_A$ [V] | −1.65 |
| $V_{nA}$ [V] | 0.65 |
| $V_{pA}$ [V] | −8.86 |
| $V_V$ [V] | 1.65 |
| $V_{nV}$ [V] | 7.79 |
| $V_{pV}$ [V] | −0.81 |

Another embodiment may be realized by moving in parallel the Λ-shaped and V-shaped characteristics in lateral axis direction by the following in FIG. 1.

(1) $V_{xA}$ and $V_{yV}$
(2) $V_{yA}$ and $V_{xV}$
(3) $V_{xA}$, $V_{yA}$, $V_{xV}$, and $V_{yV}$ According to the present invention, the control voltages in the circuit are adjusted, thereby obtaining various V-I characteristics that can be approximated to the piecewise linear functions of the third to seventh orders. Further, the various V-I characteristics are integrated as an IC form and are applied to an oscillating circuit and chaos generating circuit.

Specifically, since the N-shaped nonlinear resistor characteristic of the N-shaped nonlinear resistor circuit according to the present invention has a negative resistance area in the center, it is widely applied to the oscillating circuit and neuron circuit. In particular, the characteristic approximates to the characteristics of the third or fifth order can form a sine wave oscillating circuit and chaos generating circuit by the combination to L or C.

As mentioned above, the V-I characteristics approximate to the piecewise linear characteristics of the third to seventh orders are realized. Further, the V-I characteristic is easily variously changed by the external voltages. Although the fourth or sixth order characteristic is not widely used, it can easily be realized and therefore the additional application for the oscillating circuit is expected.

Further, the N-shaped nonlinear resistor circuit using the floating gate MOSFETs of the present invention can be integrated in the standard CMOS semiconductor process and enables the integrated circuit for various applications.

The circuit having the N-shaped voltage-current characteristic can widely be used for the sine wave oscillating circuit, double-scroll chaos circuit, and neuron circuit. This circuit structure is easily integrated as an IC form and therefore can be applied to various integrated circuits necessary for sine waves and chaos oscillating circuits. Further, the fourth or sixth order nonlinear characteristic that is not conventionally used is realized and therefore can be applied to another circuit.

The present invention is not limited to the above embodiment, can variously be modified based on the essentials of the present invention, and various modifications are not excluded from the range of the present invention.

As mentioned above in detail, according to the present invention, the following advantages are obtained.

(1) Since various N-shaped V-I characteristics are realized by the characteristics approximate to the piecewise linear functions of the third to seventh orders and they can variously be changed by the external voltages.

(2) The integration is realized by the standard CMOS semiconductor process and various applying circuits are integrated as a circuit.

INDUSTRIAL APPLICABILITIES

A nonlinear resistor circuit using floating gate MOSFETs according to the present invention is suitable as a device indicating an N-shaped voltage-current characteristic that is important as the basic components such as an oscillating circuit, chaos generating circuit, or neuron circuit, and is expected to be applied to a voltage control sine wave oscillating circuit, voltage control chaos oscillating circuit, dynamic neuron circuit, and memory circuit.

The invention claimed is:

1. A nonlinear resistor circuit using a floating gate MOSFETs, wherein a Λ-shaped nonlinear resistor circuit using a multi-input floating gate MOSFET and a V-shaped nonlinear resistor circuit using a multi-input floating gate MOSFET are connected in parallel therewith and current of said Λ-shaped nonlinear resistor circuit and current of said V-shaped nonlinear resistor circuit are added, thus to combine various N-shaped voltage-current characteristics, said N-shaped voltage-current characteristic is continuously changed, and the voltage-current characteristics approximate to piecewise linear characteristics of third to seventh orders are realized.

2. The nonlinear resistor circuit using the floating gate MOSFETs according to claim 1, wherein negative resistor portions in the voltage-current characteristic of said Λ-shaped nonlinear resistor circuit and the voltage-current characteristic of said V-shaped nonlinear resistor circuit are linear as much as possible, and both the voltage-current characteristic of said Λ-shaped nonlinear resistor circuit and the voltage-current characteristic of said V-shaped nonlinear resistor circuit are moved in parallel in the left and right directions by a voltage between an input terminal of said Λ-shaped nonlinear resistor circuit and a drain terminal of an N-channel MOSFET and a voltage between an input terminal of said V-shaped nonlinear resistor circuit and a drain terminal of a P-channel MOSFET, thus to combine the characteristic of the third order.

3. The nonlinear resistor circuit using the floating gate MOSFETs according to claim 1, wherein negative resistor portions in the voltage-current characteristic of said Λ-shaped nonlinear resistor circuit and the voltage-current characteristic of said V-shaped nonlinear resistor circuit are linear as much as possible, and both the voltage-current characteristic of said Λ-shaped nonlinear resistor circuit and the voltage-current characteristic of said V-shaped nonlinear resistor circuit are moved in parallel in the left and right directions by a voltage between the ground and a drain terminal of a floating gate P-channel MOSFET of said Λ-shaped nonlinear resistor circuit and a voltage between the ground and a drain terminal of a floating gate N-channel MOSFET of said V-shaped nonlinear resistor circuit, thus to combine the characteristic of the third order.

4. The nonlinear resistor circuit using the floating gate MOSFETs according to claim 1, wherein an inclination of a negative portion of the voltage-current characteristic of said Λ-shaped nonlinear resistor circuit or the voltage-current characteristic of said V-shaped nonlinear resistor circuit is adjusted to change the inclination of the characteristic, and the voltage-current characteristic of said Λ-shaped nonlinear resistor circuit or the voltage-current characteristic of said V-shaped nonlinear resistor circuit is moved in parallel in the left and right directions by a voltage between an input terminal of said Λ-shaped nonlinear resistor circuit and a drain terminal of an N-channel MOSFET and a voltage between an input terminal of said V-shaped nonlinear resistor circuit and a drain terminal of a P-channel MOSFET, thus to combine the fourth order characteristic.

5. The nonlinear resistor circuit using the floating gate MOSFETs according to claim 1, wherein an inclination of a negative portion of the voltage-current characteristic of said Λ-shaped nonlinear resistor circuit or the voltage-current characteristic of said V-shaped nonlinear resistor circuit is adjusted to change the inclination of the characteristic, and the voltage-current characteristic of said Λ-shaped nonlinear resistor circuit or the voltage-current characteristic of said V-shaped nonlinear resistor circuit is moved in parallel in the left and right directions by a voltage between the ground and a drain terminal of a floating gate P-channel MOSFET of said Λ-shaped nonlinear resistor circuit and a voltage between the ground and a drain terminal of a floating gate N-channel MOSFET of said V-shaped nonlinear resistor circuit, thus to combine the fourth order characteristic.

6. The nonlinear resistor circuit using the floating gate MOSFETs according to claim 1, wherein inclinations of negative portions of both the voltage-current characteristic of said Λ-shaped nonlinear resistor circuit and the voltage-current characteristic of said V-shaped nonlinear resistor circuit are adjusted to change the inclinations of the characteristics, and both the voltage-current characteristic of said Λ-shaped nonlinear resistor circuit and the voltage-current characteristic of said V-shaped nonlinear resistor circuit are moved in parallel in the left and right directions by a voltage between an input terminal of said Λ-shaped nonlinear resistor circuit and a drain terminal of an N-channel MOSFET and a voltage between an input terminal of said V-shaped nonlinear resistor circuit and a drain terminal of a P-channel MOSFET, thus to combine the fifth order characteristic.

7. The nonlinear resistor circuit using the floating gate MOSFETs according to claim 1, wherein inclinations of negative portions of both the voltage-current characteristic of said Λ-shaped nonlinear resistor circuit and the voltage-current characteristic of said V-shaped nonlinear resistor circuit are adjusted to change the inclinations of the characteristics, and both the voltage-current characteristic of said Λ-shaped nonlinear resistor circuit and the voltage-current characteristic of said V-shaped nonlinear resistor circuit are moved in parallel in the left and right directions by a voltage between the ground and a drain terminal of a floating gate P-channel MOSFET of said Λ-shaped nonlinear resistor circuit and a voltage between the ground and a drain terminal of a floating gate N-channel MOSFET of said V-shaped nonlinear resistor circuit, thus to combine the fifth order characteristic.

8. The nonlinear resistor circuit using the floating gate MOSFETs according to claim 1, wherein an inclination of a negative portion of the voltage-current characteristic of said Λ-shaped nonlinear resistor circuit or the voltage-current characteristic of said V-shaped nonlinear resistor circuit is adjusted to change the inclination of the characteristic, and both the voltage-current characteristic of said Λ-shaped nonlinear resistor circuit and the voltage-current characteristic of said V-shaped nonlinear resistor circuit are moved in parallel in the lateral axis direction by a voltage between an input terminal of said Λ-shaped nonlinear resistor circuit and a drain terminal of an N-channel MOSFET and a voltage between an input terminal of said V-shaped nonlinear resistor circuit and a drain terminal of a P-channel MOSFET, thus to combine the sixth order characteristic.

9. The nonlinear resistor circuit using the floating gate MOSFETs according to claim 1, wherein an inclination of a negative portion of the voltage-current characteristic of said Λ-shaped nonlinear resistor circuit or the voltage-current characteristic of said V-shaped nonlinear resistor circuit is adjusted to change the inclination of the characteristic, and both the voltage-current characteristic of said Λ-shaped nonlinear resistor circuit and the voltage-current characteristic of said V-shaped nonlinear resistor circuit are moved in parallel in the lateral axis direction by a voltage between the ground and a drain terminal of a floating gate P-channel MOSFET of said Λ-shaped nonlinear resistor circuit and a voltage between the ground and a drain terminal of a floating gate N-channel MOSFET of said V-shaped nonlinear resistor circuit, thus to combine the sixth order characteristic.

10. The nonlinear resistor circuit using the floating gate MOSFETs according to claim 1, wherein inclinations of negative portions of both the voltage-current characteristic of said Λ-shaped nonlinear resistor circuit and the voltage-current characteristic of said V-shaped nonlinear resistor circuit are adjusted to change the inclinations of the characteristics, and both the voltage-current characteristic of said Λ-shaped nonlinear resistor circuit and the voltage-current characteristic of said V-shaped nonlinear resistor circuit are moved in parallel in the lateral axis direction by a voltage between an input terminal of said Λ-shaped nonlinear resistor circuit and a drain terminal of an N-channel MOSFET and a voltage between an input terminal of said V-shaped nonlinear resistor circuit and a drain terminal of a P-channel MOSFET, thus to combine the seventh order characteristic.

11. The nonlinear resistor circuit using the floating gate MOSFETs according to claim 1, wherein inclinations of negative portions of both the voltage-current characteristic of said Λ-shaped nonlinear resistor circuit and the voltage-current characteristic of said V-shaped nonlinear resistor circuit are adjusted to change the inclinations of the characteristics, and both the voltage-current characteristic of said Λ-shaped nonlinear resistor circuit and the voltage-current characteristic of said V-shaped nonlinear resistor circuit are moved in parallel in the lateral axis direction by a voltage between the ground and a drain terminal of a floating gate P-channel MOSFET of said Λ-shaped nonlinear resistor circuit and a voltage between the ground and a drain terminal of a floating gate N-channel MOSFET of said V-shaped nonlinear resistor circuit, thus to combine the seventh order characteristic.

* * * * *